(12) United States Patent
Franca-Neto et al.

(10) Patent No.: US 10,283,562 B2
(45) Date of Patent: May 7, 2019

(54) PROCESS FOR FABRICATING THREE DIMENSIONAL NON-VOLATILE MEMORY SYSTEM

(71) Applicant: SANDISK TECHNOLOGIES LLC, Plano, TX (US)

(72) Inventors: Luiz M. Franca-Neto, Sunnyvale, CA (US); Mac D. Apodaca, San Jose, CA (US); Christopher J. Petti, Mountain View, CA (US)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 15/684,162

(22) Filed: Aug. 23, 2017

(65) Prior Publication Data
US 2019/0067370 A1  Feb. 28, 2019

(51) Int. Cl.
| | |
|---|---|
| *G11C 11/00* | (2006.01) |
| *H01L 27/24* | (2006.01) |
| *H01L 27/32* | (2006.01) |
| *H01L 27/112* | (2006.01) |
| *G11C 13/00* | (2006.01) |

(52) U.S. Cl.
CPC ............ *H01L 27/24* (2013.01); *H01L 27/329* (2013.01); *G11C 13/0002* (2013.01); *H01L 27/1128* (2013.01); *H01L 27/2481* (2013.01)

(58) Field of Classification Search
CPC ... H01L 27/24; H01L 27/329; H01L 27/1128; H01L 27/2481; G11C 13/0002
USPC .................................................... 365/148, 51
See application file for complete search history.

(56) References Cited

U.S. PATENT DOCUMENTS

| | | |
|---|---|---|
| 5,521,419 A | 5/1996 | Wakamiya |
| 7,251,152 B2 | 7/2007 | Roehr |
| 8,008,648 B2 | 8/2011 | Bratkovski |
| 8,619,453 B2 | 12/2013 | Scheuerlein |
| 9,202,694 B2 | 12/2015 | Konevecki |

(Continued)

OTHER PUBLICATIONS

Kim, "Resistive RAM (ReRAM) Technology for High Density Memory Applications," Samsung Electronics 4th Workshop on Innovative Memory Technologies, Jun. 2012.

(Continued)

*Primary Examiner* — Viet Q Nguyen
(74) *Attorney, Agent, or Firm* — Vierra Magen Marcus LLP

(57) ABSTRACT

A non-volatile storage apparatus is proposed that includes a plurality of serially connected non-volatile reversible resistance-switching memory cells, a plurality of word lines such that each of the memory cells is connected to a different word line, a bit line connected to a first end of the serially connected memory cells and a switch connected to a second end of the serially connected memory cells. In one embodiment, the memory cells include a reversible resistance-switching structure comprising a first material, a second material and a reversible resistance-switching interface between the first material and the second material, a channel, and means for switching current between current flowing through the channel and current flowing through the reversible resistance-switching interface in order to program and read the reversible resistance-switching interface. A process for manufacturing the memory is also disclosed.

17 Claims, 22 Drawing Sheets

(56) References Cited

U.S. PATENT DOCUMENTS

| | | |
|---|---|---|
| 9,214,225 B2 | 12/2015 | Park |
| 9,236,122 B2 | 1/2016 | Yan |
| 9,343,156 B1 | 5/2016 | Mui |
| 9,391,268 B2 | 7/2016 | Sasago |
| 9,406,693 B1 | 8/2016 | Pang |
| 9,443,910 B1* | 9/2016 | Fujiwara ............. H01L 27/2481 |
| 9,502,471 B1* | 11/2016 | Lu ....................... H01L 27/2481 |
| 9,595,530 B1 | 3/2017 | Zhou |
| 9,595,566 B2 | 3/2017 | Takaki |
| 9,613,689 B1 | 4/2017 | Takaki |
| 9,646,691 B2 | 5/2017 | Siau |
| 9,673,304 B1 | 6/2017 | Sano |
| 9,711,650 B2 | 7/2017 | Shimabukuro |
| 9,735,202 B1 | 8/2017 | Tanaka |
| 9,755,054 B2* | 9/2017 | Ryu ................... H01L 29/66742 |
| 9,818,801 B1* | 11/2017 | Rabkin ............. H01L 27/11582 |
| 9,859,337 B2* | 1/2018 | Ratnam ................. H01L 23/528 |
| 2002/0135048 A1 | 9/2002 | Ahn |
| 2006/0256609 A1 | 11/2006 | Murakami |
| 2007/0257305 A1 | 11/2007 | Sasago |
| 2008/0121961 A1* | 5/2008 | Schloesser ........ H01L 27/10876 257/302 |
| 2008/0157169 A1 | 7/2008 | Yuan |
| 2008/0259687 A1 | 10/2008 | Specht |
| 2011/0017977 A1 | 1/2011 | Bratkovski |
| 2012/0127779 A1 | 5/2012 | Scheuerlein |
| 2013/0193399 A1* | 8/2013 | Franca-Neto ......... H01L 27/228 257/5 |
| 2014/0301128 A1 | 10/2014 | Park |
| 2015/0155479 A1 | 6/2015 | Sasago |
| 2016/0020389 A1* | 1/2016 | Ratnam ................ G11C 13/004 257/2 |
| 2016/0133836 A1* | 5/2016 | Lan ......................... H01L 45/16 365/51 |
| 2016/0172368 A1 | 6/2016 | Pang |
| 2017/0025426 A1 | 1/2017 | Kano |
| 2017/0200501 A1 | 7/2017 | Yang |
| 2017/0221559 A1* | 8/2017 | Chen .................. G11C 13/0007 |
| 2017/0250224 A1* | 8/2017 | Ratnam ................ H01L 23/528 |
| 2017/0373086 A1 | 12/2017 | Pang |
| 2018/0182771 A1* | 6/2018 | Costa ................ H01L 27/11524 |

OTHER PUBLICATIONS

Kinoshita, et al., "Scalable 3-D vertical chain-cell-type phas-change memory with 4F2 poly-Si diodes," Symposium on VLSI Technology (VLSIT), 2012.

Xu, et al., "Architecting 3D Vertical Resistive Memory for Next-Generation Storage Systems," IEEE/ACM International Conference on Computer-Aided Design (ICCAD), 2014.

Franca-Neto, et al., "Non-Volatile Memory System," U.S. Patent Application filed on Aug. 23, 2017.

Franca-Neto, et al., "Memory Cell for Non-Volatile Memory System," U.S. Patent Application filed on Aug. 23, 2017.

Office Action dated Sep. 12, 2018, U.S. Appl. No. 15/684,150.

PCT International Search Report dated Jul. 20, 2018, PCT Patent Application No. PCT/US2018/032775.

PCT Written Opinion of the International Searching Authority dated Jul. 20, 2018, PCT Patent Application No. PCT/US2018/032775.

Office Action dated Mar. 29, 2018, U.S. Appl. No. 15/684,150.

Response to Office Action dated Apr. 27, 2018, U.S. Appl. No. 15/684,150.

Notice of Allowance dated Nov. 15, 2018, U.S. Appl. No. 15/684,150.

Response to Office Action dated Dec. 19, 2018, U.S. Appl. No. 15/684,141.

Response to Office Action dated Sep. 25, 2018, U.S. Appl. No. 15/684,150.

Office Action dated Oct. 5, 2018, U.S. Appl. No. 15/684,141.

* cited by examiner

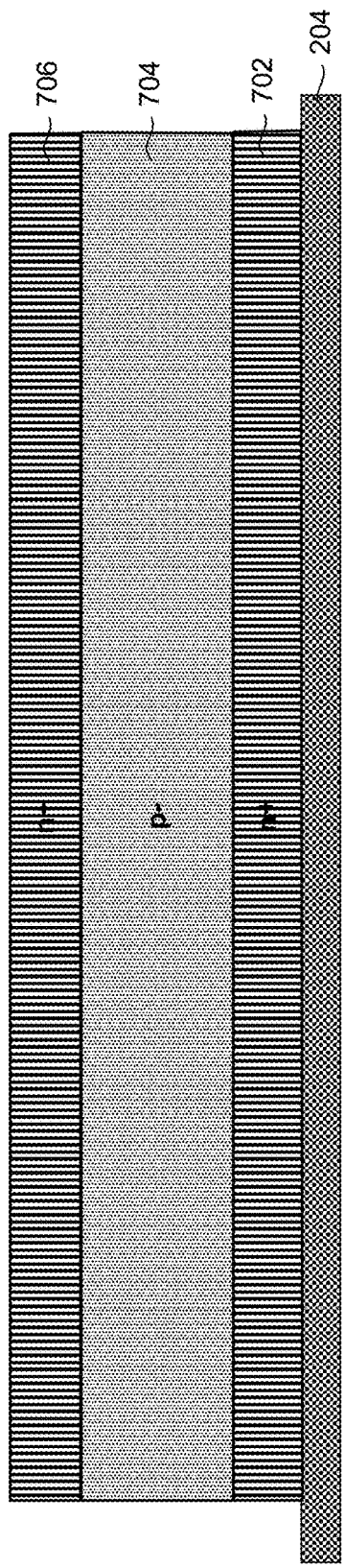
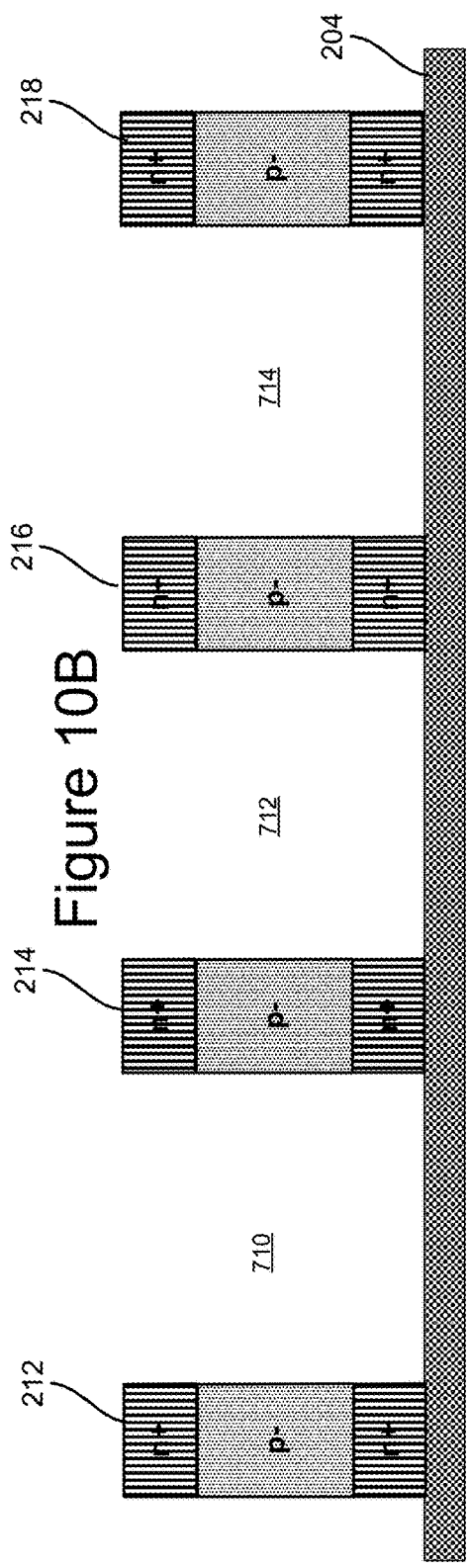

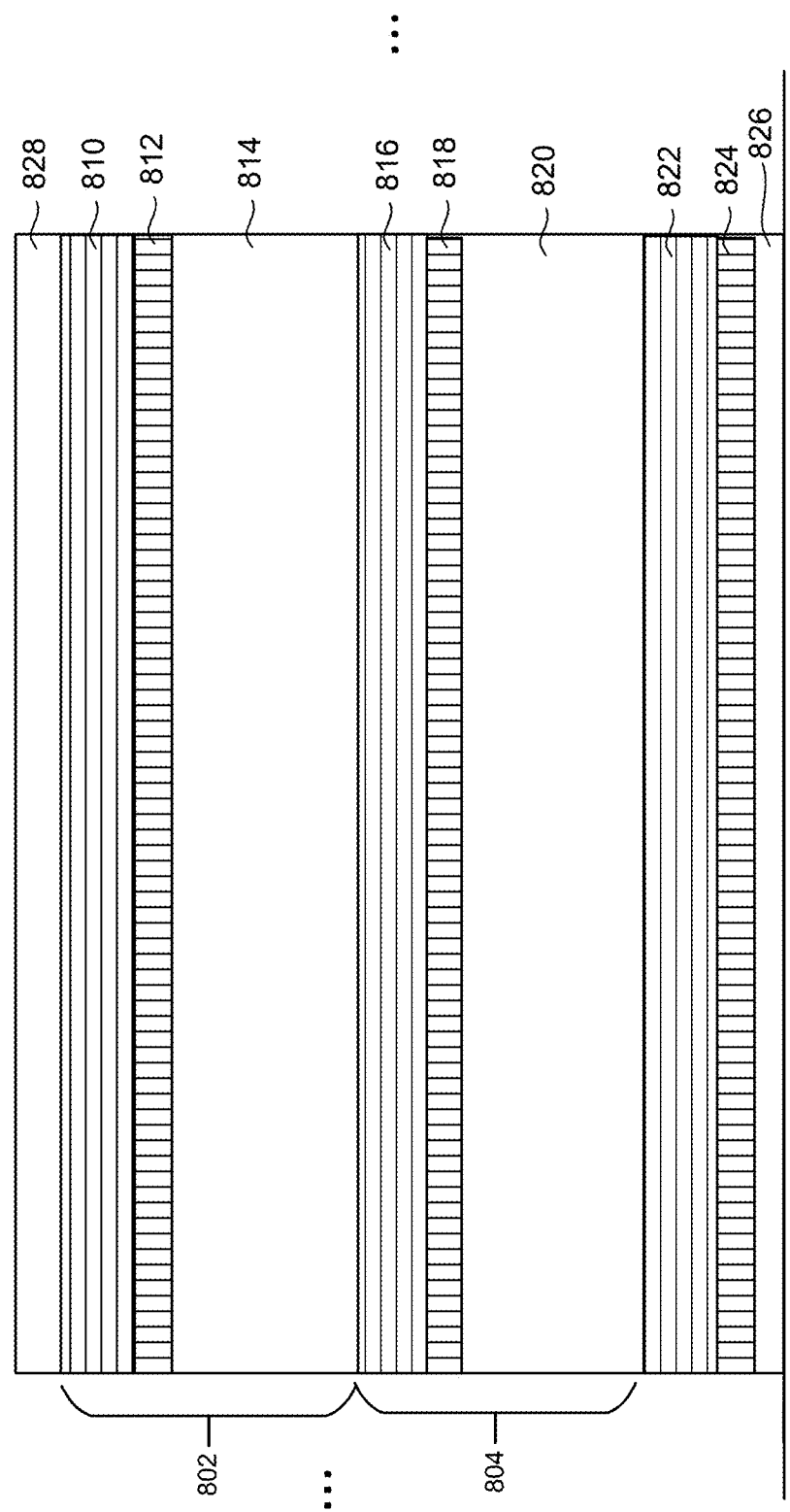

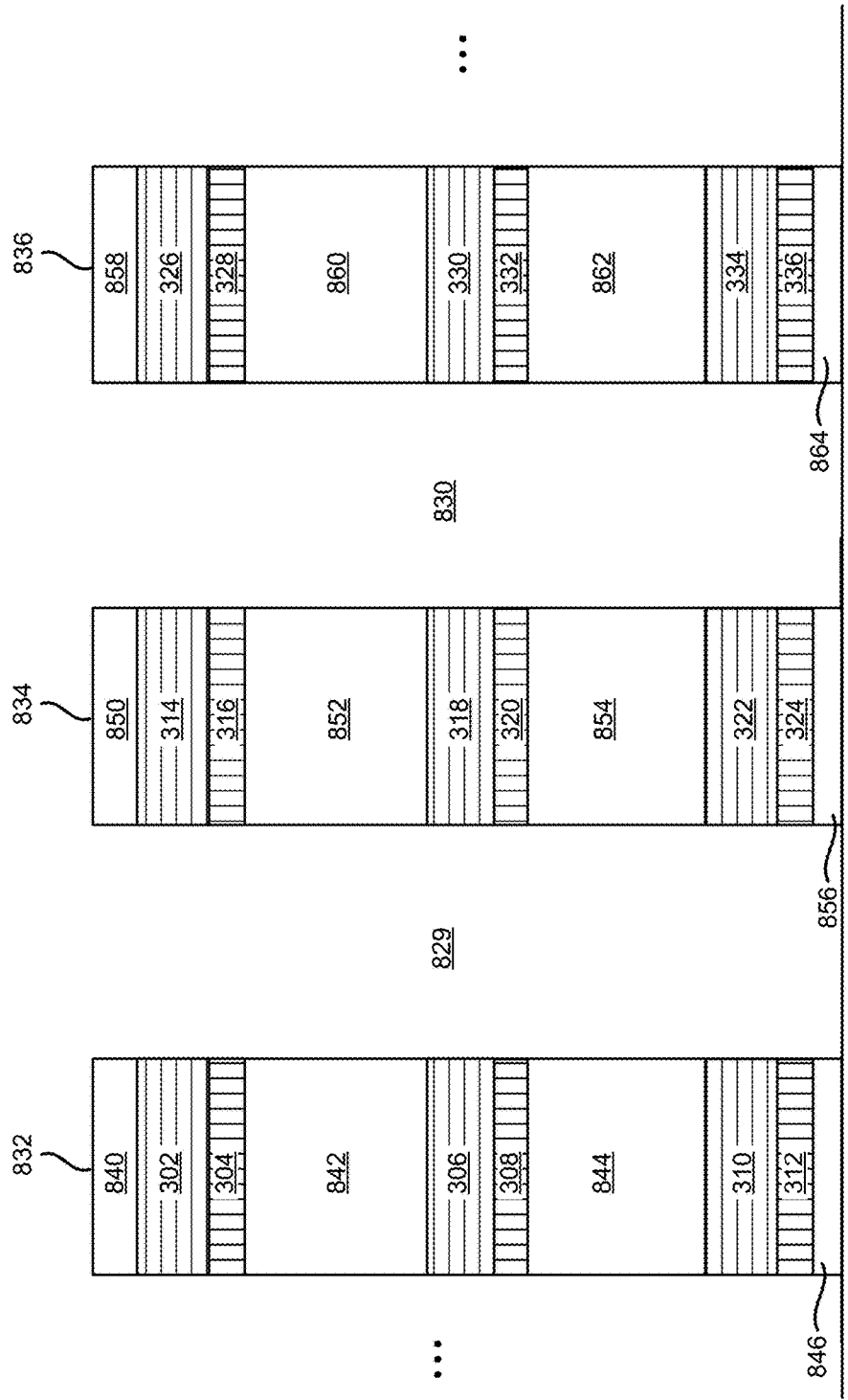

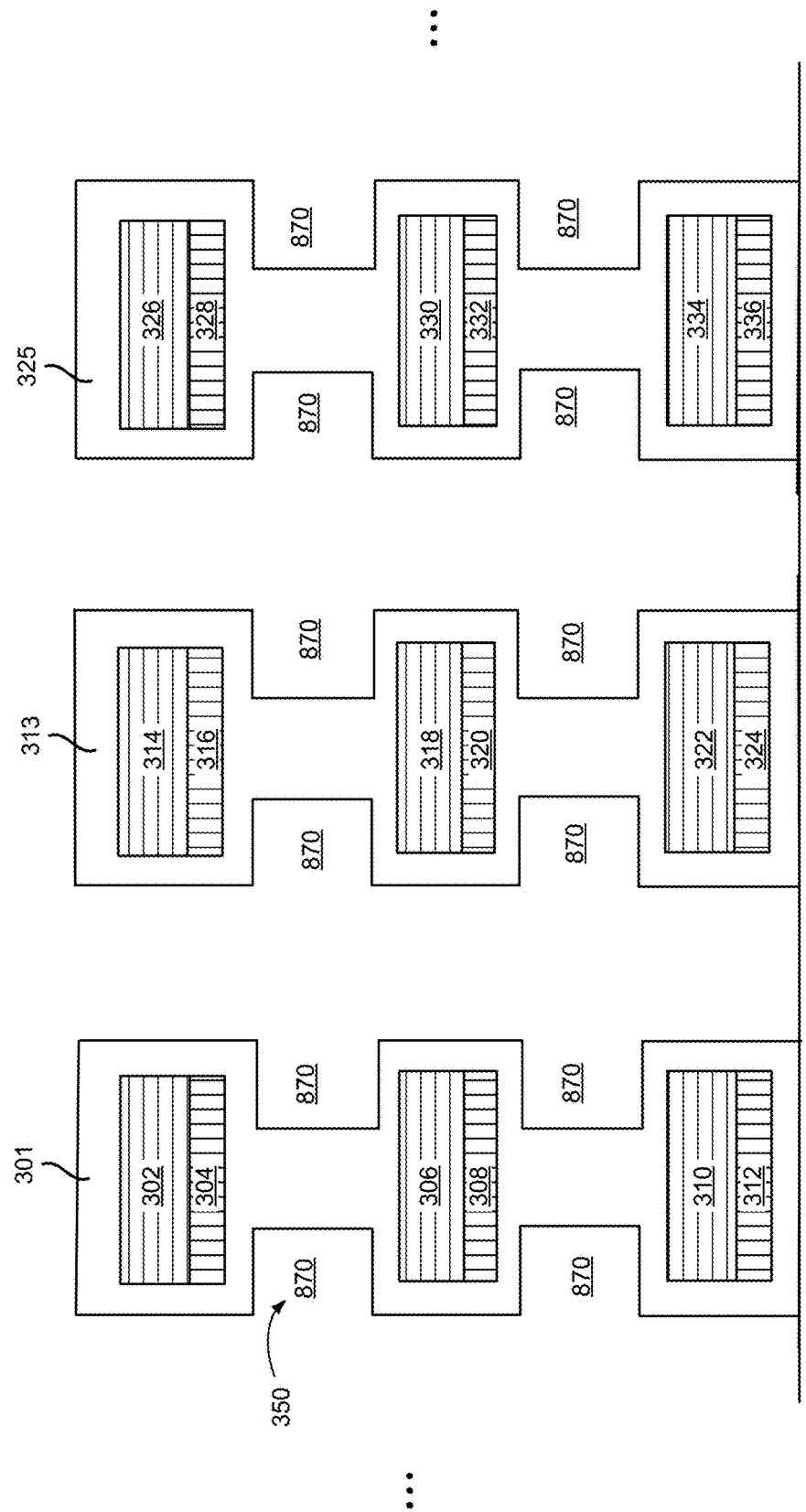

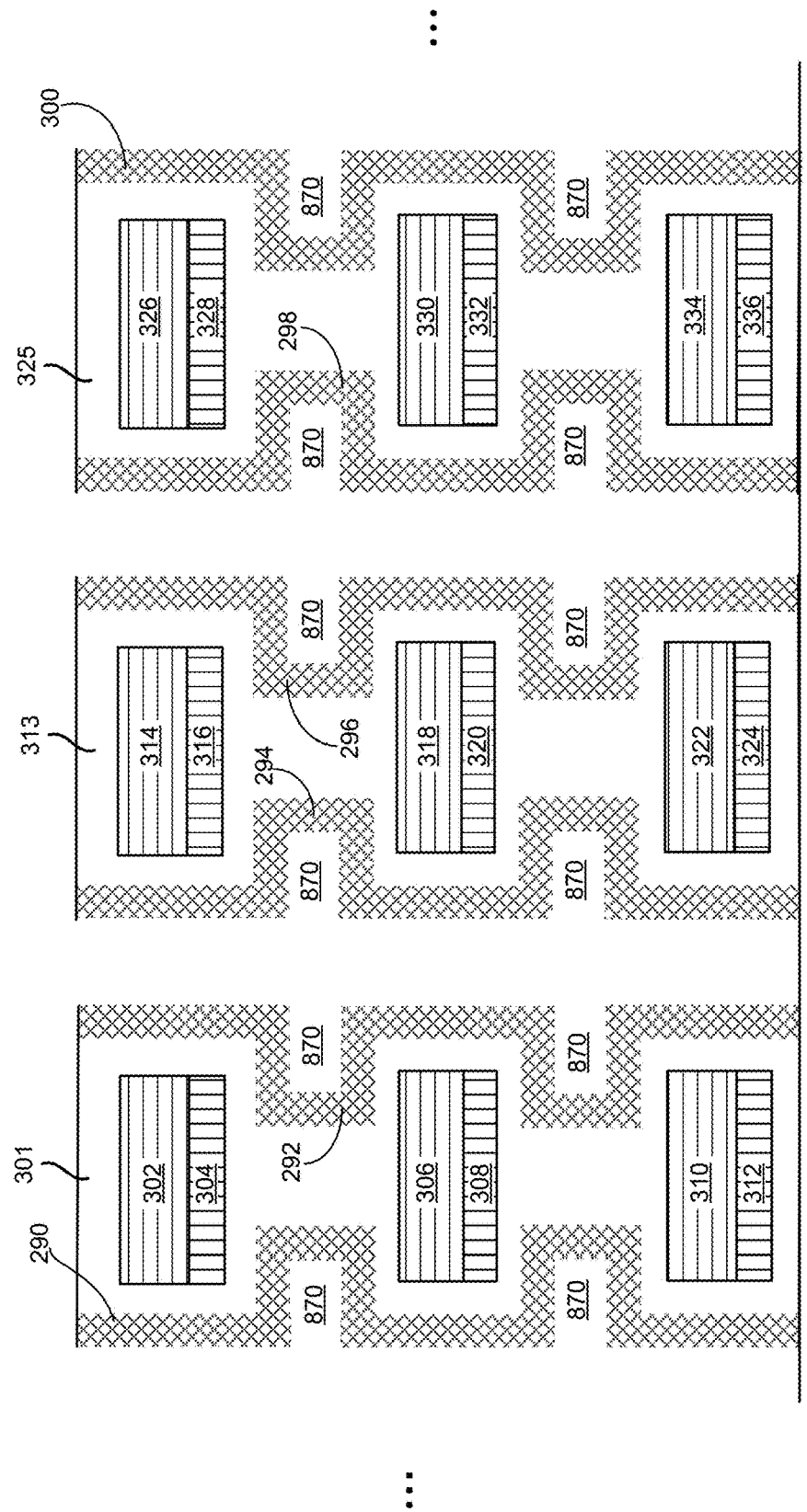

US 10,283,562 B2

PROCESS FOR FABRICATING THREE DIMENSIONAL NON-VOLATILE MEMORY SYSTEM

BACKGROUND

Semiconductor memory is widely used in various electronic devices such as cellular telephones, digital cameras, personal digital assistants, medical electronics, mobile computing devices, and non-mobile computing devices. Semiconductor memory may comprise non-volatile memory or volatile memory. A non-volatile memory allows information to be stored and retained even when the non-volatile memory is not connected to a source of power (e.g., a battery).

One example of non-volatile memory uses reversible resistance-switching memory elements that may be set to either low or high resistance states. Upon application of sufficient voltage, current, or other stimulus, the reversible resistance-switching memory element switches to a stable low-resistance state, which is sometimes referred to as SETTING the device. This resistance-switching is reversible such that subsequent application of an appropriate voltage, current, or other stimulus can serve to return the reversible resistance-switching material to a stable high-resistance state, which is sometimes referred to as RESETTING the device. This conversion can be repeated many times.

Three dimensional ("3D") memory arrays having reversible resistance-switching memory elements have been proposed. In one possible architecture, word lines extend horizontally and bit lines extend vertically. There a multiple levels of the word lines, hence multiple levels of memory elements. Each memory element is located between one of the vertical bit lines and one of the horizontal word lines. During operation, some of the memory cells are selected for the SET or RESET, while others are unselected.

As some memory systems are used in portable electronic devices that utilize batteries, conserving power is a goal.

BRIEF DESCRIPTION OF THE DRAWINGS

Like-numbered elements refer to common components in the different figures.

FIGS. 10A-D depict cross sections of a selection layer during various stages of fabrication.

FIGS. 12A-H depict cross sections of a memory layer during various stages of fabrication.

DETAILED DESCRIPTION

A non-volatile storage apparatus is proposed that includes a plurality of serially connected non-volatile reversible resistance-switching memory cells, a plurality of word lines such that each of the memory cells of the plurality is connected to a different word line, a bit line connected to a first end of the serially connected memory cells and a switch connected to a second end of the serially connected memory cells.

In one embodiment, the memory cells include a reversible resistance-switching structure comprising a first material, a second material and a reversible resistance-switching interface between the first material and the second material, a channel, and means for switching current between current flowing through the channel and current flowing through the reversible resistance-switching interface in order to program and read the reversible resistance-switching interface.

With the above described structure, memory cells that are not intended to be subjected to a memory operation (e.g., programming or reading) can be completely unselected so that they do not leak (causing loss of power) and do not otherwise materially alter the memory operation (e.g., programming or reading).

Figure 1:
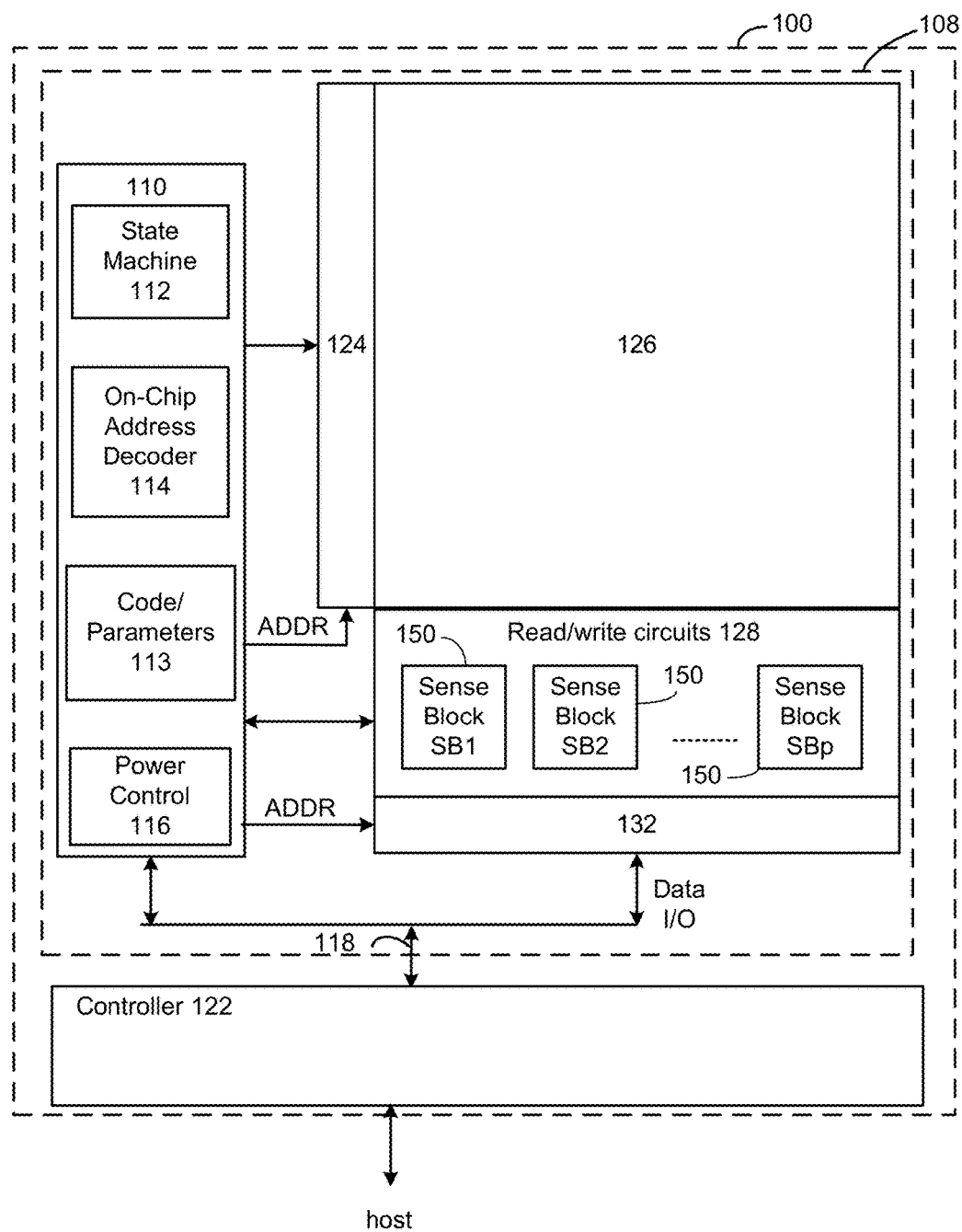
FIG. 1 is a block diagram of an example memory system that can implement the proposed technology.

FIG. 1 is a functional block diagram of an example memory system 100 that can implement the proposed technology. The components depicted in FIG. 1 are electrical circuits. Memory system 100 includes one or more memory die 108. Each memory die 108 includes a three dimensional memory structure 126 of memory cells (such as, for example, a 3D array of memory cells), control circuitry 110, and read/write circuits 128. In other embodiments, the three dimensional memory array can be fabricated on top of CMOS circuits or a two dimensional array of memory cells can be used. Memory structure 126 is addressable by word lines via a row decoder 124 and by bit lines via a column decoder 132. The read/write circuits 128 include multiple sense blocks 150 including SB1, SB2, . . . , SBp (sensing circuitry) and allow a page of memory cells to be read or programmed in parallel. Each of the sense blocks 150 include a sense amplifier connected to one or more respective bit lines. In some systems, a controller 122 is included in the same memory system 100 (e.g., a removable storage card) as the one or more memory die 108. However, in other systems, the controller can be separated from the memory die 108. In some embodiments the controller will be on a different die than the memory die. In some embodiments, one controller 122 will communicate with multiple memory die 108. In other embodiments, each memory die 108 has its own controller. Commands and data are transferred between a host and Controller 122 via a data bus, and between controller 122 and the one or more memory die 108 via signal lines 118 (e.g., a Toggle Mode interface). In one embodiment, memory die 108 includes a set of input and/or output (I/O) pins that connect to lines 118.

Memory structure 126 may comprise one or more arrays of memory cells including a 3D memory array, as discussed below. The memory structure may comprise a monolithic three dimensional memory structure in which multiple memory levels are formed above (and not in) a single substrate, such as a wafer, with no intervening substrates.

Control circuitry 110 cooperates with the read/write circuits 128 to perform memory operations on memory structure 126, and includes a state machine 112, an on-chip address decoder 114, and a power control module 116. The state machine 112 provides chip-level control of memory operations. Code and parameter storage 113 may be provided for storing operational parameters and software. In one embodiment, state machine 112 is programmable by the software stored in code and parameter storage 113. In other embodiments, state machine 112 does not use software and is completely implemented in hardware (e.g., electrical circuits). On set of examples of memory operations includes programming and reading. Programming can include SETTING and RESETTING, as discussed above. Other types of programming can also be implemented.

The on-chip address decoder 114 provides an address interface between addresses used by the host or memory controller 122 to the hardware address used by the decoders 124 and 132. Power control module 116 controls the power and voltages supplied to the word lines and bit lines during memory operations. It can include drivers for word line layers in a 3D configuration, select transistors (switches) and source lines. Power control module 116 may include charge pumps for creating voltages. The sense blocks include bit line drivers (e.g., as part of the sense amplifiers).

Any one or any combination of control circuitry 110, state machine 112, decoders 114/124/132, code and parameter storage 113, power control module 116, sense blocks 150, read/write circuits 128, and Controller 122 can be considered one or more control circuits that performs the functions described herein.

In one set of embodiments, the memory cells comprising memory structure 126 are Barrier Modulated Memory Cells, in which the resistance of the memory cell is modulated by separation or recombination of oxygen vacancies and interstitial oxygen ions at a reversible resistance-switching interface between two materials. When the interstitial oxygen ions combine with the oxygen vacancies, a zone with a low density of charge carriers is formed at the interface due to reduction in oxygen vacancies, thereby increasing the resistance of the memory cell. This operation is herein referred to as a "RESETTING" operation. When the interstitial oxygen ion and oxygen vacancy pairs are created due to the separation of the interstitial oxygen ion from the vacancy lattice site, a zone with a high density of charge carriers is formed due to creation of oxygen vacancies, thereby decreasing the resistance of the memory element. This operation is herein referred to as a "SETTING" operation. Some example structures include an active layer and a barrier layer in contact with each other at the interface. The active layer includes a material that provides different resistance depending on the state of oxygen vacancies therein. Specifically, when oxygen vacancies are depleted at the interface with the barrier layer, the active layer at the interface of the active layer and the barrier layer is in a high resistance state, or a "reset" state. When oxygen vacancies are repopulated at the interface with the barrier layer, the active layer (at the interface) is in a low resistance state at the interface, or a "set" state. For example, the active layer can include titanium oxide (e.g., sub-stoichiometric titanium oxide having less than two oxygen atoms for each one titanium atom) or tantalum oxide (TaOx). Other materials can also be used. The barrier layer includes a material that provides a suitable band gap in a range from 0.6 eV to 7.6 eV in order to provide a suitable level of electrical isolation. For example, the barrier layer can include a material that provides a suitable electronic barrier to limit current through the active layer. In one embodiment, the barrier layer can include a material such as amorphous silicon (a semiconductor material) or aluminum oxide. More details of such memory cells can be found in U.S. Pat. No. 9,613,689, incorporated herein by reference. This particular memory system is used here for illustration only. The skilled in the art will realize other material systems can also be used.

Figure 2:
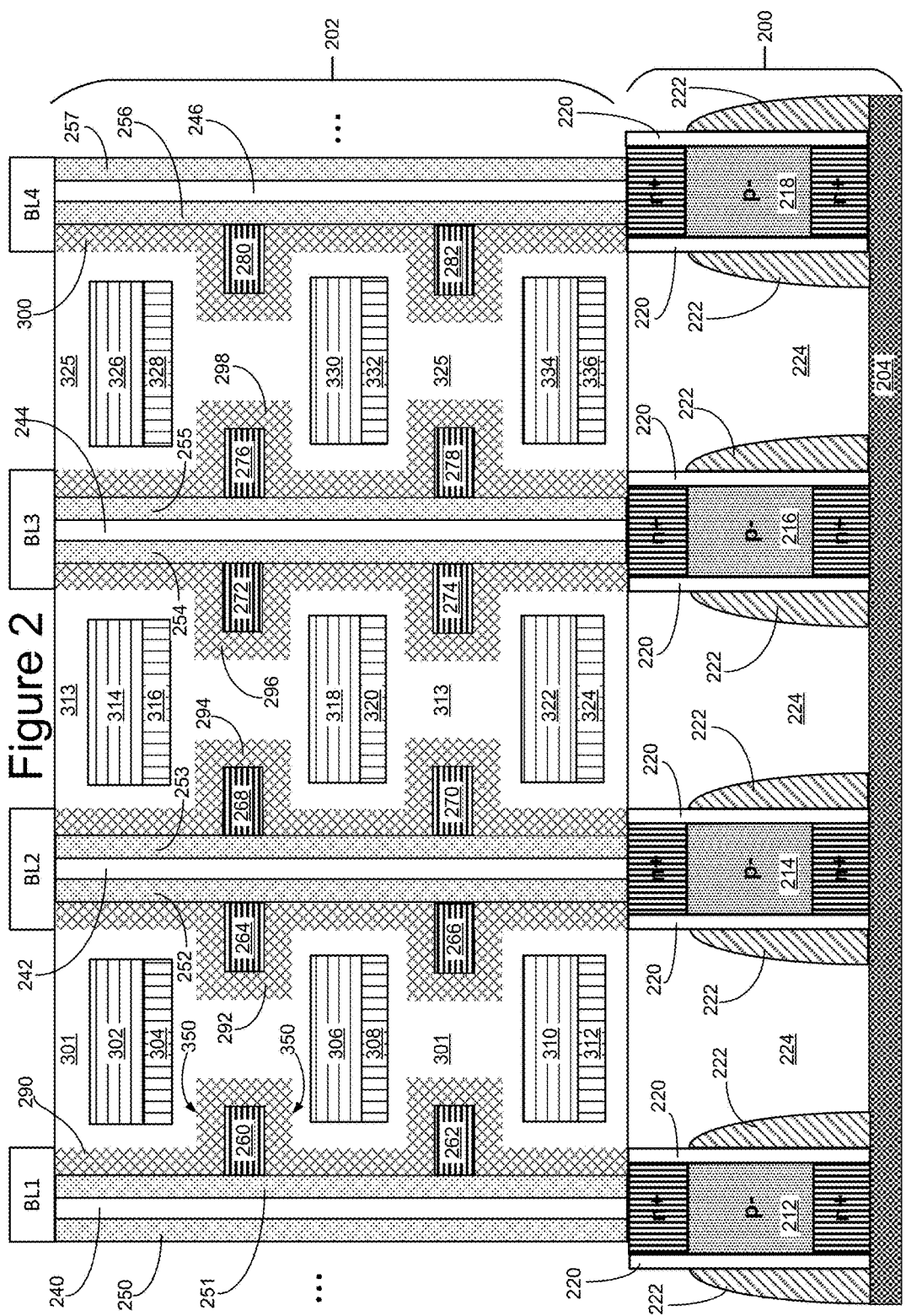
FIG. 2 depicts a cross section of an example monolithic three dimensional memory structure that includes serially connected non-volatile reversible resistance-switching memory cells.

FIG. 2 depicts a cross section of an example monolithic three dimensional memory structure that includes serially connected non-volatile reversible resistance-switching Barrier Modulated Memory Cells. The memory structure depicted in FIG. 2 is one example of memory structure 126 of FIG. 1.

The memory structure includes a selection layer 200 positioned on top of metal line 204 and a memory layer 202 positioned on top of selection layer 200. In one embodiment, metal line 204 is a source line that can be connected to a voltage source (e.g., a charge pump) or to ground. Selection layer 200 includes a plurality of vertically oriented transistors serving as switches. For example, FIG. 2 shows a subset of those switches including switches 212, 214, 216 and 218. Each of the switches is an NPN transistor that includes a vertical stack of a lower n+ layer, a p– layer above the lower n+ layer, and an upper n+ layer above the p– layer. On both sides of the NPN stack is dielectric material 220 (e.g., $SiO_2$). Outside of the dielectric layer 220 are gate layers 222 (e.g., Si), in the shape of fins. Between gates 222 is dielectric material 224 (e.g., $SiO_2$).

Memory layer 202 includes pluralities of serially connected non-volatile reversible resistance-switching memory cells, a plurality of word lines such that each of the memory cells of a plurality of serially connected memory cells are connected to a different word line of the plurality of word lines, bit lines connected to a first end of each of the sets of serially connected non-volatile reversible resistance-switching memory cells and selection switches (in the selection layer 200) are connected to a second end of the pluralities of serially connected non-volatile reversible resistance switching memory cells.

Above each of the switches 212, 214, 216, 218 are columns that include three pillars. The middle pillar is a plugging dielectric (e.g., $SiO_2$). For example, FIG. 2 shows plugging dielectric regions 240, 242, 244 and 246. Each of the columns further includes barrier layers on different sides of each of the plugging dielectrics. On the left side of dielectric 240 is barrier layer 250 and one the right side is barrier layer 251. On the left side of plugging dielectric 242 is barrier layer 252 and on the right side is barrier layer 253. On the left side of plugging dielectric 244 is barrier layer 254 and on the right side is barrier layer 255. On the left side of plugging dielectric 246 is barrier layer 256 and on the right side is barrier layer 257. In one embodiment, the barrier layers are made up of amorphous silicon, and represent the barrier layers of the barrier modulated memory cells discussed above. Adjacent each of the barrier layers are active layers that are also part of the barrier modulated memory cells discussed above. For example, adjacent barrier layer 251 are active layer 260 and active layer 262. Adjacent barrier layer 252 are active layer 264 and active layer 266. Adjacent barrier layer 253 are active layer 268 and active layer 270. Adjacent barrier layer 254 are active layer 272 and active layer 274. Adjacent barrier layer 255 are active layer 276 and active layer 278. Adjacent barrier 256 are active layer 280 and active layer 282. FIG. 2 shows only a portion of the memory structure. Therefore, there are active layers that are also adjacent barrier layers 250 and 257. Furthermore, the memory structure continues in both directions (left of page and right of page). Furthermore, FIG. 2 shows that the active layers are vertically displaced. That is, the active layers are positioned above consecutive or adjacent active layers. FIG. 2 only shows two rows of active layers. However, it is contemplated that some embodiments of the memory structure will include more than two rows of active layers. In some examples, there can be 4 rows of active layers, 8 rows of active layers, 16 rows of active layers, 32 rows of active layers, 64 rows of active layers, etc. In one embodiment, the active layers are made of Tantalum Oxide (TaOx).

Adjacent to barrier layers and surrounding the active layers on three sides of the active layers are channel layers (e.g., Silicon). For example, FIG. 2 shows channel layer 290 adjacent barrier 251 and surrounding active layers 260 and 262 on three sides of each active layer. Channel layer 290 is an electrical contact with switch 212 and bit line BL1. Channel 292 is adjacent barrier level 252, surrounding active layers 264 and 266 on at least three sides of each active layer and in electrical contact with bit line BL2 and switch 214. Channel 294 is adjacent barrier layer 253, surrounding active layers 268 and 270 on three sides of each active layer, in electrical contact with switch 214 and in electrical contact with bit line BL2. Channel 296 is adjacent barrier layer 254, surrounds active layers 272 and 274 on three sides of each active layer, in electrical contact with switch 216 and in electrical contact with bit line BL3. Channel layer 298 is adjacent barrier layer 255, surrounds active layers 276 and 278 on three sides of each active layer, in electrical contact with switch 216 and in electrical contact with bit line BL3. Channel layer 300 is adjacent barrier layer 256, surrounds active layers 280 and 282 on three sides of each active layer, is in electrical contact with switch 218 and is in electrical contact with bit line BL4. As depicted in FIG. 2, each of the channel layers 290, 292, 294, 296, 298 and 300 are vertically elongated and directly connect to a bit line, where the bit line connects to a corresponding sense amplifier.

Each of the active layers and the associated adjacent portions of the barrier layers form the non-volatile reversible resistance-switching memory cells, which are vertically displaced as depicted in FIG. 2. Active layers 260 and 262 are part of one plurality of serially connected non-volatile reversible resistance-switching memory cells. Active layers 264 and 266, and their associated adjacent portions of the barrier layers, are part of another plurality of serially connected non-volatile reversible-resistance switching memory cells. Active layers 268 and 270, and their associated adjacent portions of the barrier layers, are part of another plurality of serially connected non-volatile reversible resistance-switching memory cells. Active layers 272 and 274, and their associated adjacent portions of the barrier layers, are part of another plurality of serially connected non-volatile reversible resistance-switching memory cells. Active layers 276 and 278, and their associated adjacent portions of the barrier layers, are part of another plurality of serially connected non-volatile reversible resistance-switching memory cells. Active layers 280 and 282, and their associated adjacent portions of the barrier layers, are part of another plurality of serially connected non-volatile reversible resistance-switching memory cells.

The structure of FIG. 2 also includes dielectric regions 301, 313 and 325. In one example embodiment, these dielectric regions are made of $SiO_2$. As can be seen from FIG. 2, the dielectric regions 301, 313 and 325 form pockets. For example one of those pockets is labeled with reference number 350 in FIG. 2. A portion of channel region 290 is positioned in pocket 350. Additionally, a portion of active layer 260 is positioned in pocket 350. A portion of each of the active layers is positioned in one of the pockets of the dielectric regions.

Within dielectric regions 301, 313 and 325 are a plurality of vertically displaced control line layers. Each control line layer is positioned between two consecutive reversible resistance-switching elements (e.g., active layers+adjacent portion of barrier layers). Each control line comprises an offset layer and associated word line layer. Examples of control line layers depicted in FIG. 2 include word line layer 302 and adjacent offset layer 304 directly below word line layer 302, word line 306 and adjacent offset layer 308 directly below word line layer 306, word line layer 310 and adjacent offset layer 312 directly below word line layer 310, word line 314 and adjacent offset layer 316 directly below word line layer 314, word line layer 318 and offset layer 320 directly below word line layer 318, word line layer 322 and adjacent offset layer 324 directly below word line layer 322, word line 326 and adjacent offset layer 328 directly below word line 326, word line 330 and adjacent offset layer 332 directly below word line layer 330, and word line layer 334 and adjacent offset layer 336 directly below word line layer 334. In other embodiments, there can be more than three rows of control line layers. No specific number of rows is required. In one embodiment, the word line layers are made of p doped silicon and the offset layers are made of $Si_3N_4$. Other materials can also be used. Each of the word line layers can control the active layers immediately above the word line layer. The offset layers, in contact with and just below the associated word line layer, serve to shield the associated word line layers from controlling the active layers directly below the offset layer. Therefore, while a word line is vertically displaced between two consecutive active layers the word line can only control the top active layer because the associated offset layer shields the word line layer from controlling the other active layer below the offset layer. For example, word line layer 306 can control active layer 260; however, offset 308 shields word line 306 from controlling active layer 262.

FIG. 2 only depicts a portion of the memory structure. In one embodiment, the memory structure will continue to the left and to the right of the cross section depicted in FIG. 2. Furthermore, FIG. 2 is a cross section. In another embodiment, the memory structure will extend with more layers and cells vertically. Therefore, the structure continues into and out of the page for multiple horizontal layers. That is each of the word line layers are in a direction in and out of the page. Behind the columns and active layers depicted in FIG. 2 will be additional sets of active layers in corresponding locations to create additional sets of serially connected memory cells.

Figure 3:
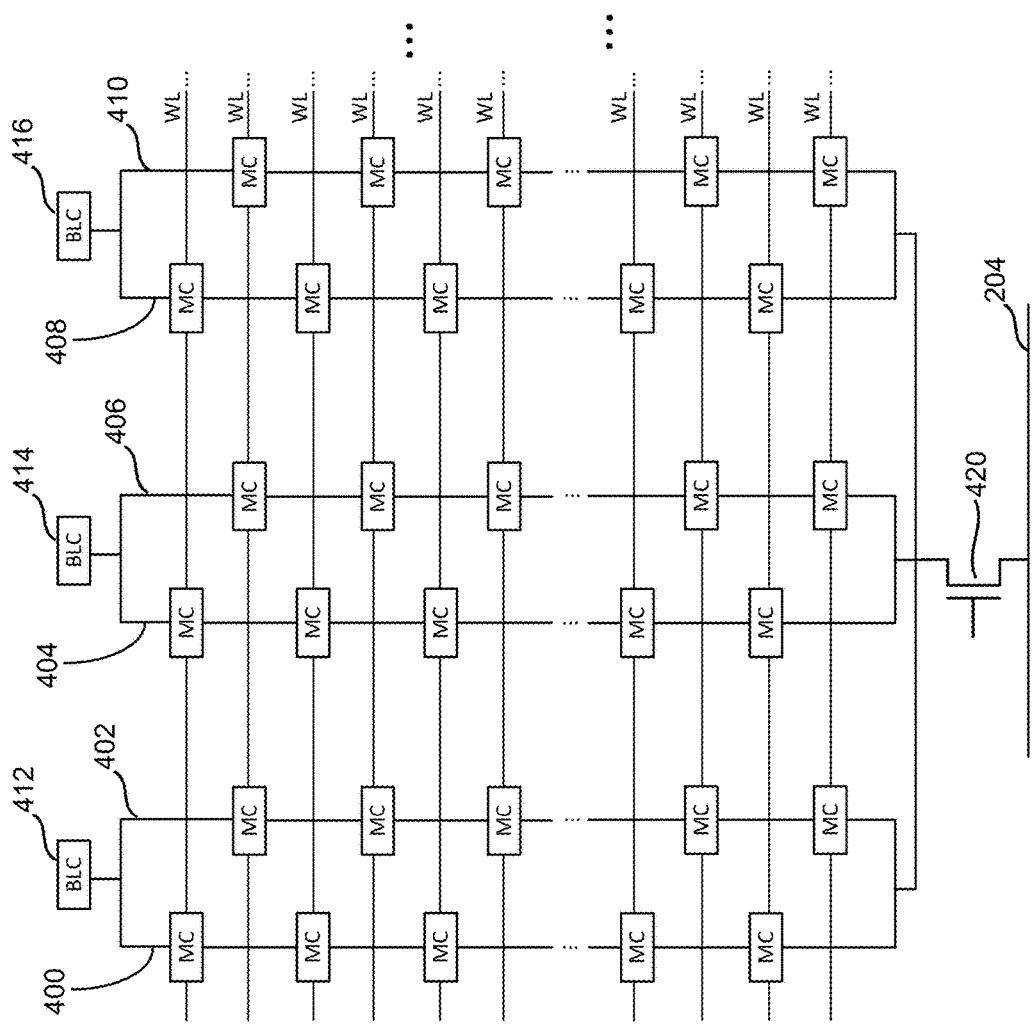
FIG. 3 depicts a circuit diagram of a portion of the memory structure that includes serially connected non-volatile reversible resistance-switching memory cells.

FIG. 3 depicts a circuit diagram of a portion of the memory structure of FIG. 2 that includes serially connected non-volatile reversible resistance-switching memory cells. FIG. 3 shows a plurality of serially connected non-volatile reversible resistance-switching memory cells 400 connected to switch 420 and bit line contact 412, plurality of serially connected non-volatile reversible resistance-switching memory cells 402 also connected to switch 420 and bit line contact 412, plurality of serially connected non-volatile reversible resistance-switching memory cells 404 connected to bit line contact 414 and switch 420, plurality of serially connected non-volatile reversible resistance-switching memory cells 406 connected to bit line contact 414 and switch 420, plurality of serially connected non-volatile reversible resistance-switching memory cells 408 connected to bit line contact 416 and switch 420, and plurality of serially connected non-volatile reversible resistance-switching memory cells 410 connected to bit line contact 416 and switch 420. Ellipses are used in FIG. 3 to indicate that the structure will continue. Each of the memory cells (MC) is serially connected to neighboring memory cells within the same plurality of memory cells (also referred to as a string). Each string or plurality of serially connected memory cells are connected on one end to switch 420 and at another end to a respective bit line contact BLC (and respective bit line). Switch 420 connects the memory cells to source line 204 (see also FIG. 2). FIG. 3 shows three pairs of connected memory cells. A second pair (404 and 406) can be located behind the first pair (400 and 402) and the third pair (408 and 410) can be located behind the second pair (404 and 406) when looking at the structure of FIG. 2. The skilled in the art will recognize that other electrical arrangement of wordlines (WLs), bitlines (BLCs) and selecting transistors (420) are possible without departing from the spirit of the technology proposed herein.

Figure 4B:
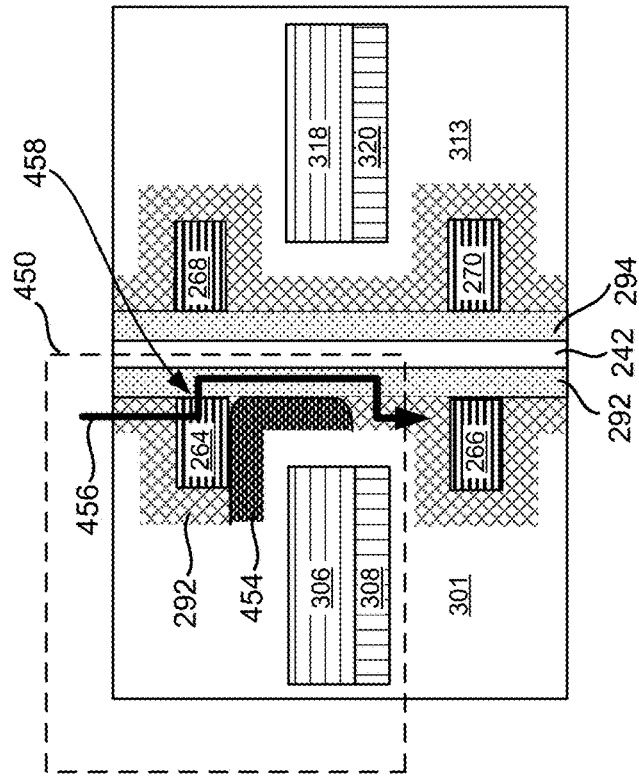
FIGS. 4A and 4B depict an example memory cell that is part of a plurality of serially connected non-volatile reversible resistance-switching memory cells.
Figure 4A:
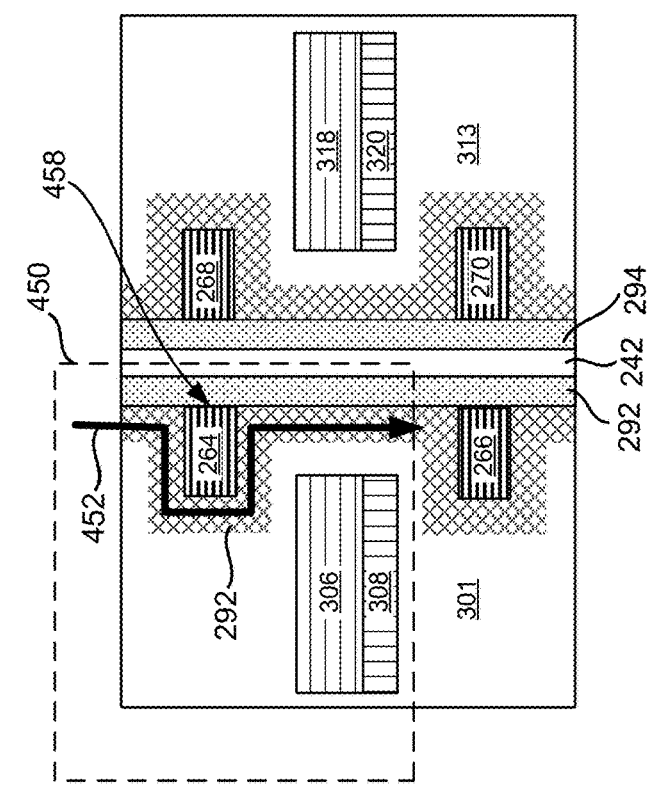

FIGS. 4A and 4B depict operation of example memory cells that is part of a plurality of serially connected non-volatile reversible resistance-switching memory cells. The structure of FIG. 4A includes four memory cells. One of those memory cells 450 is indicated by the dashed line forming a box. Memory cell 450 includes active layer 264, a portion of barrier layer 292, word line layer 306 and offset layer 308. Below offset 308 is another active layer 266 which is shielded from word line layer 306 by offset layer 308. That structure including active layers 264 and 266 represents a first reversible resistance-switching structure, a second reversible resistance-switching structure, a control region comprising a word line layer 306 and an offset layer 308 adjacent to the word line layer. The word line layer 306 is on a first side of the control region facing the first reversible resistance-switching structure. The offset layer 308 is on the second side of the control region facing the second reversible resistance switching structure (e.g., 266). The offset layer 308 shields word line layer 306 from controlling active layer 266. FIG. 4A shows a situation when memory cell 450 is not selected for a memory operation. For example, word line 306 is at ground or a very low voltage. In this case, memory cell 450 is unselected so that current flows through channel 292 for the memory cell and bypasses the reversible resistance-switching interface 458 between active layer 264 and barrier layer 292, as depicted by arrow 452.

In FIG. 4B, memory cell 450 is selected for a memory operation. For example, memory cell 450 is to be programmed or read. The memory cell is selected so that current now flows through the reversible resistance-switching interface 458 between active layer 264 and barrier 292 and bypasses at least a portion of channel 292. In this situation a larger voltage (e.g., proximately 5 volts) is applied to word line 306. This voltage creates a depletion region 454 in channel 292. Current from channel region 292 is forced into active layer 264, through interface 258 and into barrier layer 292 (bypassing a portion of channel 292 because the current avoids the depletion region 454), as depicted by arrow 456. FIG. 4 going through the interface between active layer 264 and barrier region 292. Therefore, using gate 306 to turn on or off the depletion region switches the flow of current between the channel 292 or the interface 458 and, therefore, is one example of a means for switching current between current flowing through the channel and current flowing through the reversible resistance-switching interface in order to program and read the reversible resistance-switching interface 458.

The memory cells of FIGS. 4A and 4B comprises a first current path and a second current path, where the first current path is reversible resistance-switching (e.g., through interface 458 as per arrow 456) and the second current path (e.g., channel 292) bypasses the first current path (as per arrow 452).

Figure 5:
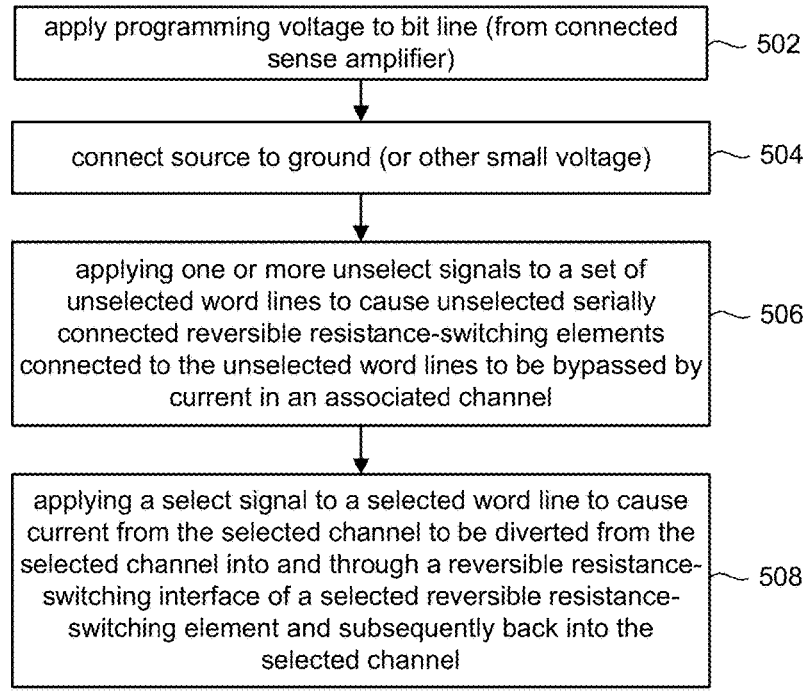
FIG. 5 is a flow chart describing one embodiment of a process for SETTING memory cells.

FIG. 5 is a flow chart describing one embodiment of a process for SETTING the memory cells. During the process of FIG. 5, the memory cells being SET will experience the situation depicted graphically in FIG. 4B. The process of FIG. 5 is performed using the control circuitry discussed above in FIG. 1 in order to control the memory cells of memory structure 126 (depicted in FIGS. 2 and 4A/B). In step 502 of FIG. 5, the one or more control circuits apply a programming voltage to a selected bit line. As discussed above, each bit line is connected to a sense amplifier. Therefore, the sense amplifier (see corresponding Sense Block SBp) provides a programming voltage (e.g., 5 volts) to the selected bit line. In step 504, the source line (e.g., line 204) is connected to ground (or another small voltage). In step 506, one or more unselected signals are applied to unselected word lines to cause the unselected serially connected reversible resistance-switching memory cells connected to the unselected word lines to be bypassed by current in associated channels. That is, memory cells not to be SET will be bypassed by applying an unselect signal (e.g., 0 volts) to the corresponding word lines so that the memory cells operates according to FIG. 4A. In step 508, the one or more control circuits will apply a select signal to a selected word line to cause current from the selected channel to be diverted from the selected channel into and through a reversible resistance-switching interface of a selected reversible resistance-switching memory cell and subsequently back into the selected channel. That is, selected memory cells will have their corresponding word lines receive a select signal (e.g., 5 volts) in order to create a depletion region in the corresponding channels so that the memory cell operates according to FIG. 4B. As a result, the memory cell will be SET.

Figure 6:
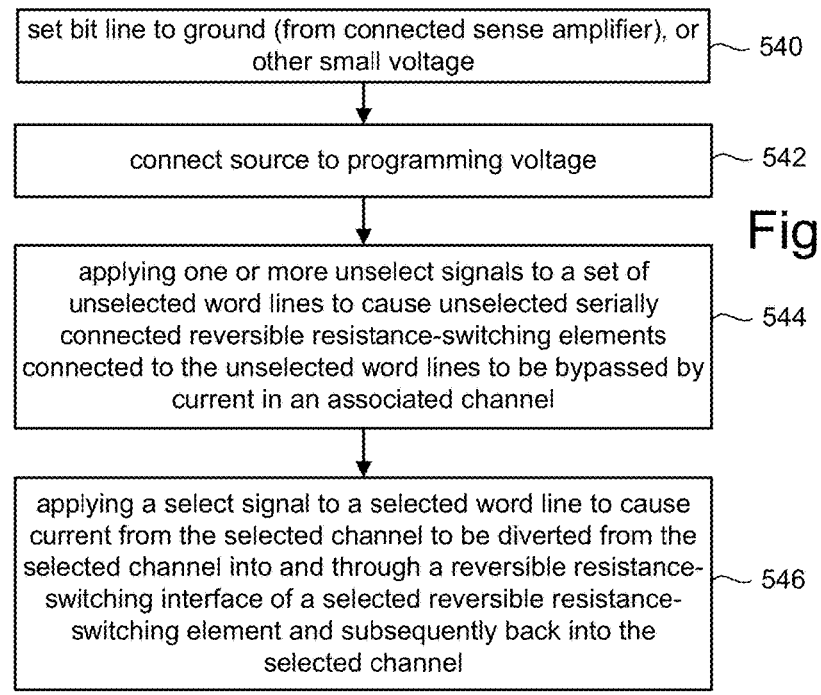
FIG. 6 is a flow chart describing one embodiment of a process for RESETTING memory cells.

FIG. 6 is a flow chart describing one embodiment of a process for RESETTING memory cells. In step 540, bit lines are set to ground. For example, the connected sense amplifier can ground the bit line. Instead of ground, a small voltage can be used. In step 542, the source line (e.g., line 204 of FIG. 2) is connected to a programming voltage (e.g., 5 volts). In step 544, one or more unselect signals are applied to the set of unselected word lines to cause unselected serially connected reversible resistance-switching elements connected to the unselected word lines to be bypassed by current in the associate channel. Therefore, the unselected memory cells will operate according to FIG. 4A. In step 546, the one or more control circuits apply a select signal to the selected word line to cause current from the selected channel to be diverted from the selected channel into and through a reversible resistance-switching interface of a selected reversible resistance-switching element and subsequently back into the selected channel. Therefore, selected memory cells will operate based on FIG. 4B. As a result, the selected memory cells will be reset.

Figure 7:
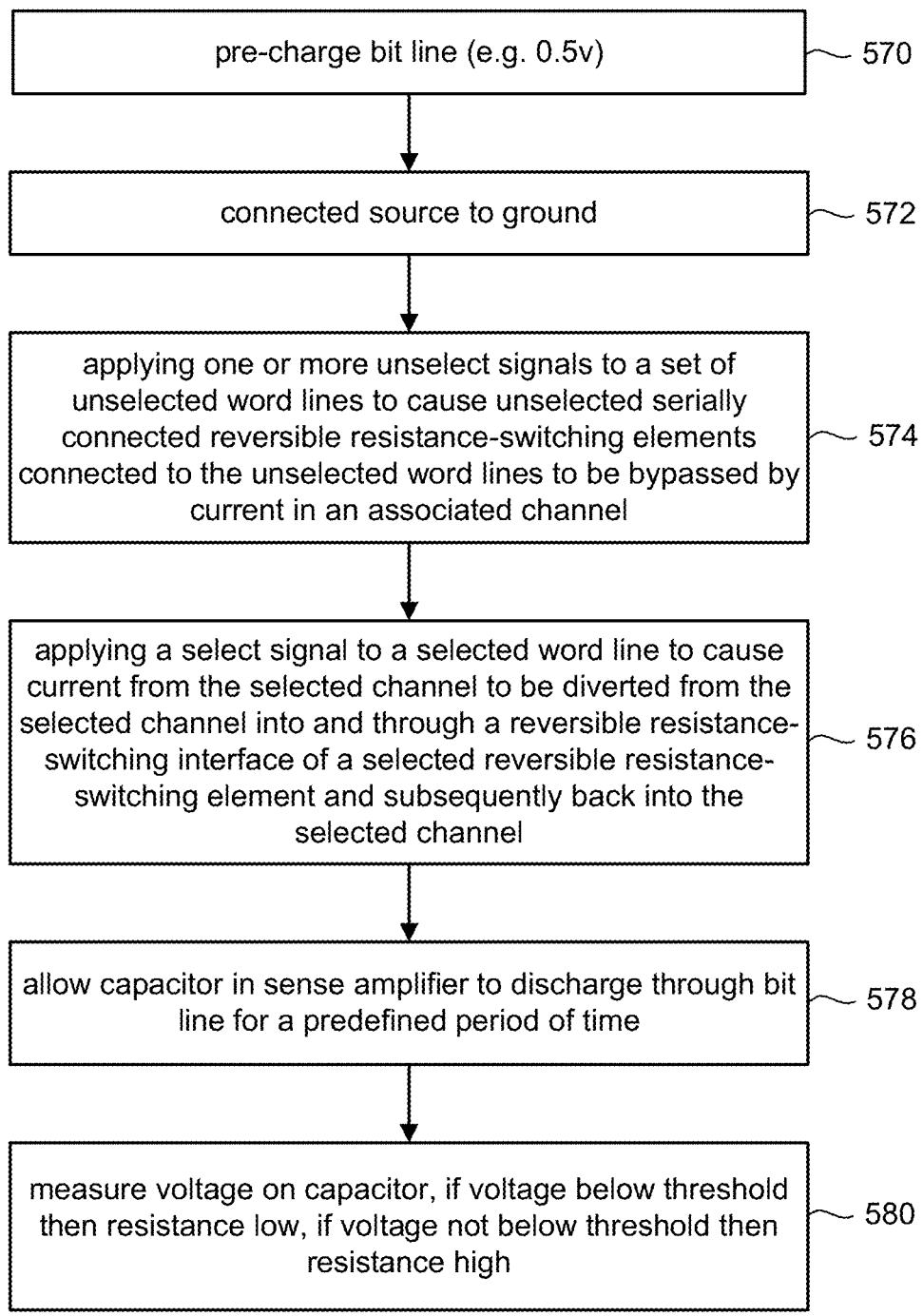
FIG. 7 is a flow chart describing one embodiment of a process for reading memory cells.

FIG. 7 is a flow chart describing one embodiment of a process for reading memory cells. The process of FIG. 7 is performed by the one or more control circuits of FIG. 1. In one embodiment, each sense amplifier that is connected to a bit line will include a capacitor. This capacitor is charged up. Then during the reading process it is attempted to discharge the capacitor through a bit line connected to the memory cell being read. Based on how much charge the capacitor discharges it can be determined whether the memory cell being read was in a high resistance state or a low resistance state. Other forms of sense amplifiers can also be used. In step 570, the bit line is pre-charged to a pre-charge voltage. One example of a pre-charge voltage is 0.5 volts. In step 572, the source line is connected to ground. For example, metal line 204 is connected to ground. Additionally, the appropriate select devices (e.g., 212, 214, 216, 218) are turned on to connect the source line to the plurality of serially connected memory cells. In step 574, the one or more control circuits apply one or more unselect signals to a set of unselected word lines that cause unselected serially connected reversible resistance-switching elements connected to the unselected word lines to be bypassed by current through associated channel. Therefore, the unselected memory cells will operate as depicted in FIG. 4A. In step 576, the one or more control circuits apply a select signal to a selected word line to cause current from the selected channel to be diverted from the selected channel into and through a reversible resistance-switching interface of a selected reversible resistance-switching element and subsequently back into the selected channel. Therefore, selected memory cells will operate as depicted in FIG. 4B. As described, those memory cells that are not selected to be read will be bypassed while the memory cells selected to be read will have current (discharge from the capacitor) passing through the memory cells being read. In step 578, the system will allow the capacitor in the sense amplifier to discharge through the bit line for a predefined period of time. In step 580, the system measures the voltage across the capacitor in the sense amplifier. If the voltage is below a threshold then the resistance of the memory cell being read is a low resistance. If the voltage is not below the threshold then the resistance of the memory cell being read is high resistance.

Figure 8:
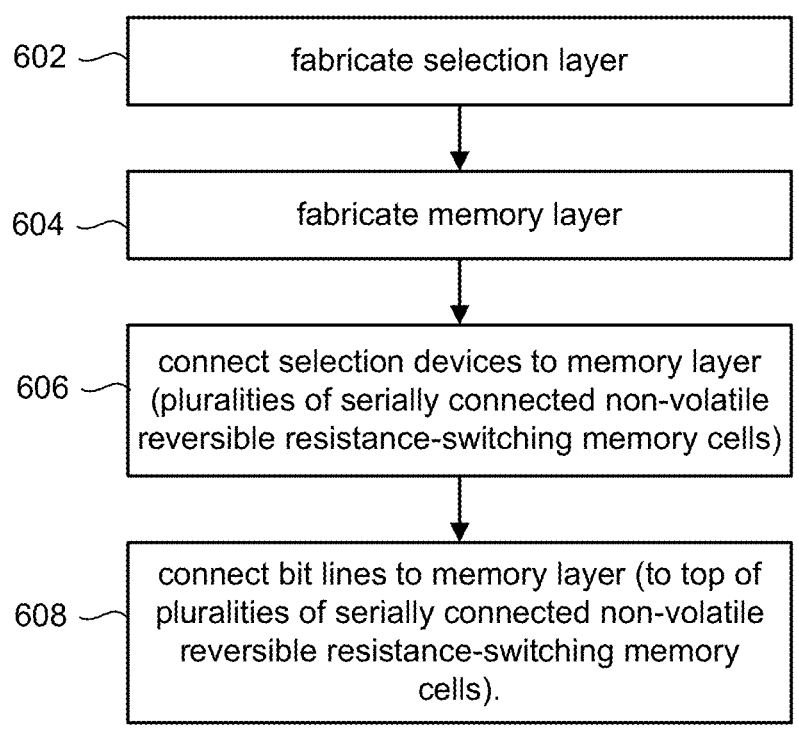
FIG. 8 is a flow chart describing one embodiment of a process for fabricating an example memory structure.

FIG. 8 is a flow chart describing one embodiment of a process for fabricating an example memory structure, such as the memory structure of FIG. 2. In step 602 of FIG. 8, selection layer 200 is fabricated. In step 604, memory layer 202 is fabricated. In step 606, the selection devices (e.g., switches 212, 214, 216 and 218) of selection layer 200 are connected to memory layer 202 (e.g., are connected to the pluralities of serially connected non-volatile reversible resistance-switching memory cells). In step 608, the bit lines are connected to the memory layer. For example, but lines (BL1-BL4) are connected to the top of the channels of the plurality of serially connected non-volatile reversible resistance-switching memory cells.

Figure 9:
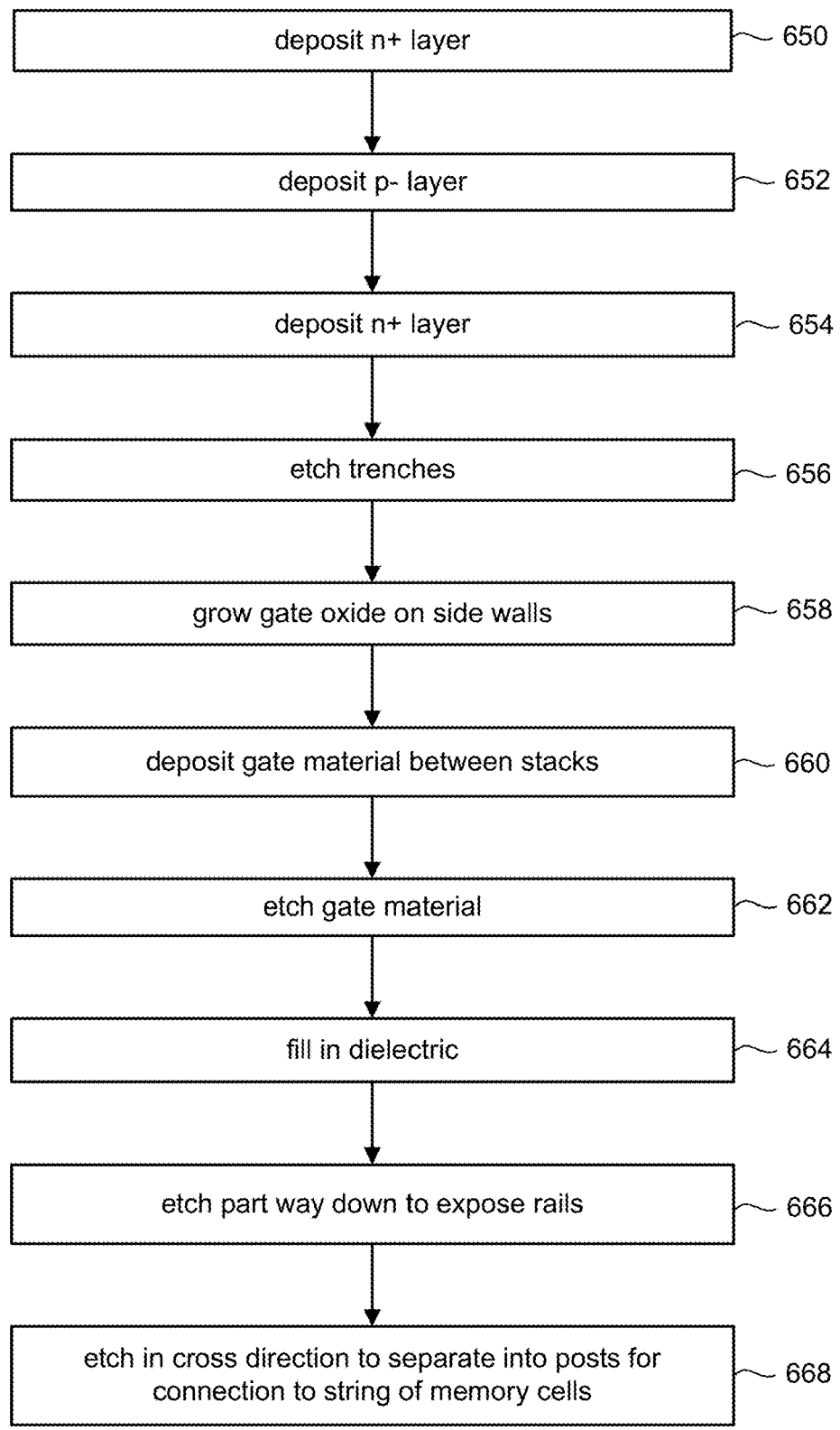
FIG. 9 is a flow chart describing one embodiment of a process for fabricating an example selection layer.

FIG. 9 is a flow chart describing one embodiment of a process for fabricating an example selection layer 200. Thus, the process of FIG. 9 is one example implementation of step 602 of FIG. 8. In step 650, an n+ layer will be deposited. For example, this can be accomplished using Chemical Vapor Deposition ("CVD") or Atomic Layer Deposition ("ALD"). In step 652, a p– layer will be deposited on top of the n+ layer. The p– layer is deposited using CVD or ALD. In step 654, an n+ layer will be deposited on top of the p– layer of step 652 using CVD or ALD. FIG. 10A depicts the state of the structure after step 654. As can be seen, the structure includes n+ layer 702 (from step 650), p– layer 704 (from step 652), and n+ layer 706 (from step 654). N+ layer 702 is positioned on top of metal line 204 (see FIG. 2).

In step 652 of FIG. 9, trenches will be etched through the three layers using a reactive ion etch. FIG. 10B shows the structure with trenches 710, 712 and 714. FIG. 10B only shows a portion of the complete structure; therefore, only three trenches are depicted. In the actual structure, there will be many more than three trenches. As a result of the etching, NPN stacks are formed corresponding to switches 212, 214, 216 and 218 (see FIG. 2).

Figure 10C:
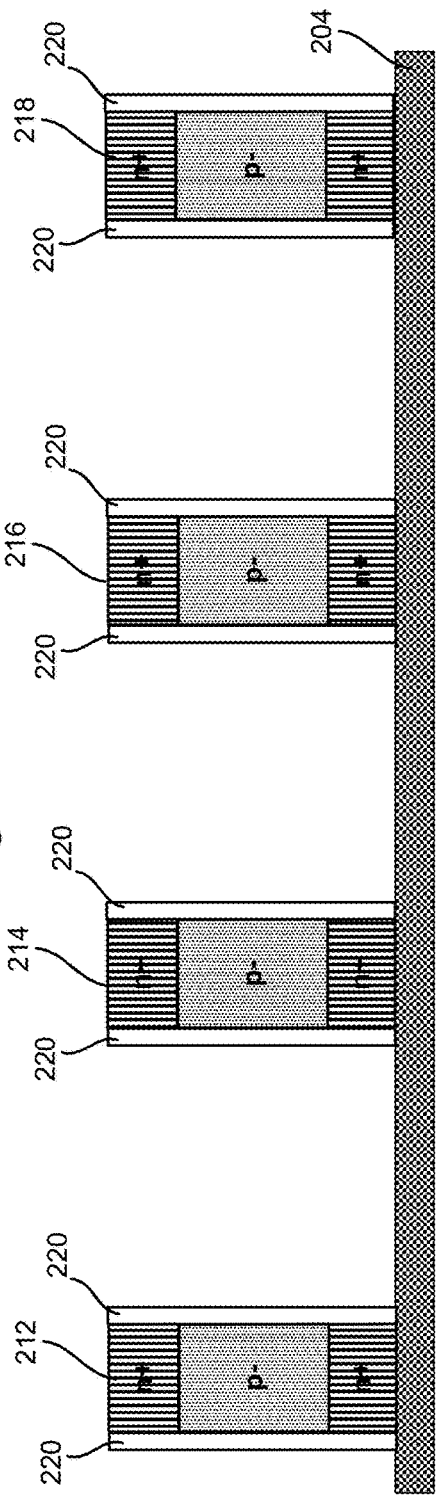

In step 658 of FIG. 9, an oxide will be grown on the side walls of each of the NPN stacks. In one embodiment, $SiO_2$ if thermally grown on the side of each of the NPN stacks. FIG. 10C shows oxide 220 on the side of NPN stacks corresponding to switches 212, 214, 216 and 218.

Figure 10D:
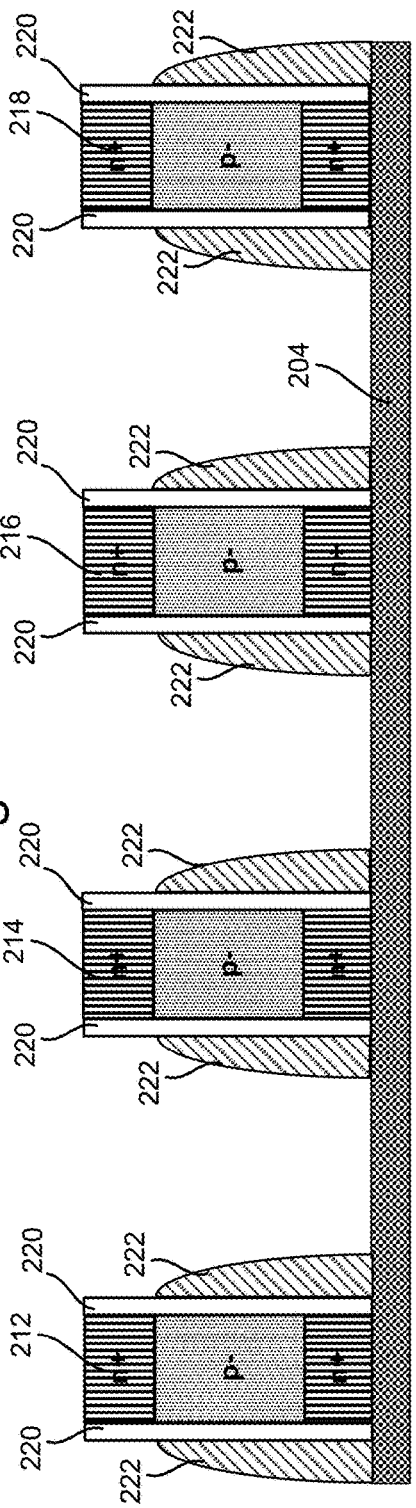

In step 660 of FIG. 9, gate material will be deposited between the stacks. For example, Silicon will be deposited using CVD or ALD. In step 662, the gate materials will be etched using a reactive ion etch. FIG. 10D shows the structure after step 652, including gates 222 in the shape of fins as a result of the reactive ion etch.

In step 664 of FIG. 9, the trenches will be filled in with a dielectric (e.g., $SiO_2$) using CVD or ALD. The dielectric is filled above the top of the NPN stacks corresponding to switches 212-218. These stacks are also referred to as rails. In step 666, the process will etch the dielectric part way down to expose the top of the rails/switches. In step 668, the process will etch in a cross direction to separate the rails into posts for connection to the strings of serially connected memory cells. The result of step 668 is depicted at the bottom of FIG. 2.

Figure 11:
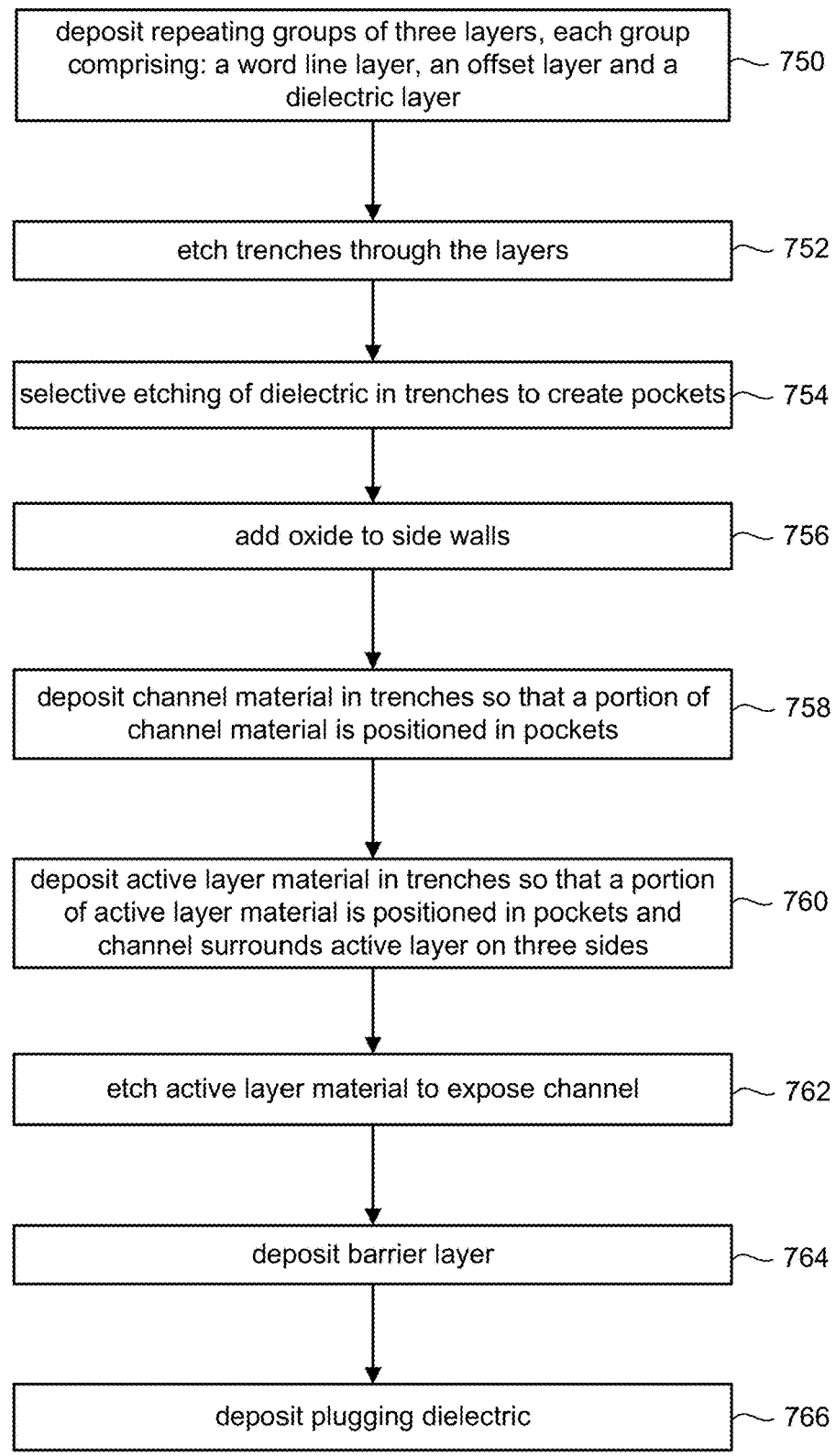
FIG. 11 is a flow chart describing one embodiment of a process for fabricating an example memory layer.

FIG. 11 is a flow chart describing one embodiment of a process of fabricating an example memory layer (e.g., memory layer 202 of FIG. 2). Therefore, the process of FIG. 11 is one example implementation of step 604 of FIG. 8. In step 750 of FIG. 11, the fabrication process includes depositing repeating groups of three layers (or at least three layers—as additional layers can be included with the three layers). Each group comprise a word layer (e.g., p-Si), an offset layer (e.g., $Si_3N_4$) and a dielectric layer (e.g., $SiO_2$). FIG. 12A depicts the results of step 750. For example, FIG. 12A shows a first group 802 of three layers and a second group 804 of three layers. Three layers of group 802 include word line layer 810, offset layer 812 and dielectric layer 814. The three layers of group 804 include word line layer 816, offset layer 818 and dielectric layer 820. In some embodiments, the structure includes more than two groups of three layers. In addition, additional layers outside any of the groups can be included. For example, FIG. 12A shows word line 822, offset layer 824 and dielectric layer 826, as well as dielectric layer 828.

In step 752, trenches are etched through the layers. The result of step 752 is depicted in FIG. 12B, which shows trenches 829 and 830 etched into the layers. Step 752 results in the creation of a set of stacks 832, 834 and 836. Stack 832 includes dielectric layer 840, word line layer 302, offset layer 304, dielectric layer 842, word line layer 306, offset layer 308, dielectric layer 844, word line layer 310, offset layer 312, and dielectric layer 846. Stack 834 includes dielectric layer 850, word line layer 314, offset layer 316, dielectric layer 852, word line layer 319, offset layer 320, dielectric layer 854, word line layer 322, offset layer 324, and dielectric layer 856. Stack 836 includes dielectric layer 858, word line layer 336, offset layer 328, dielectric layer 860, word line layer 330, offset layer 332, dielectric layer 862, word line layer 334, offset layer 336, and dielectric layer 864.

In step 754, selective etching is performed on the dielectric areas in the trenches to create pockets. With selective etching, $SiO_2$ etches faster. For example, a wet etching process can be used. In step 756, oxide is added to the sidewalls of the trenches. For example, conformal oxide deposition or ALD can be used. The result of the steps 754 and 756 is depicted in FIG. 12C. As can be seen, a set of pockets 870 have been selectively etched into the dielectric regions 301, 313 and 325. Note that one of the pockets is also labeled with reference on the 350 to show FIG. 12C correlating to FIG. 2. As discussed above, portions of the channels and the active layers will later be positioned inside pockets 870.

In step 758, channel material (e.g., Si) is deposited in the trenches so that at least a portion of that channel material is positioned in the pockets 870. In one example, CVD or ALD is used to deposit the channel material. FIG. 12D depicts the result of step 758. As can be seen, channels 290, 292, 294, 296, 298 and 300 have been added such that a portion of those channels are inside the pocket 870.

Figure 12E:
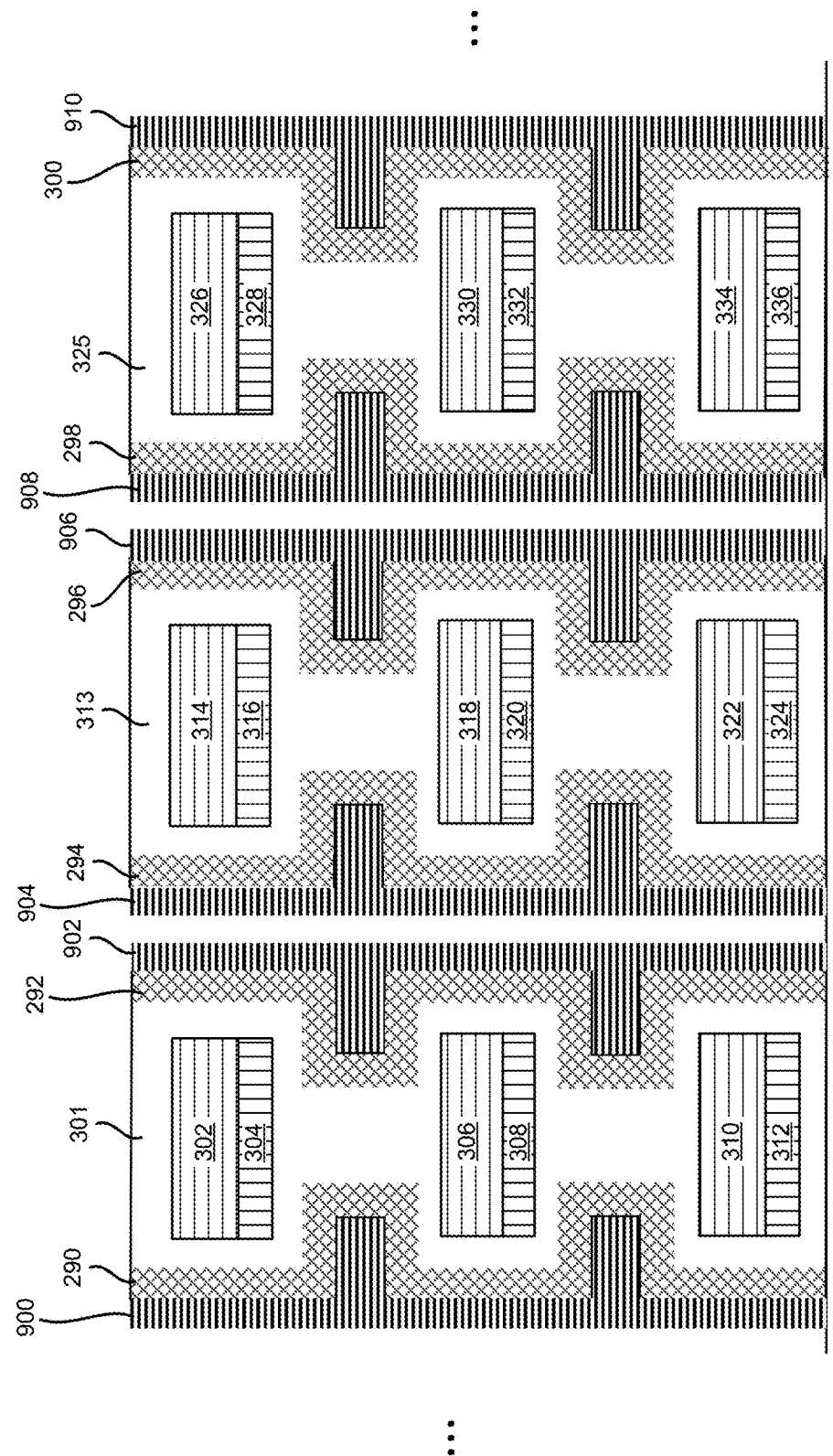

In step 760 of FIG. 11, active layer material (e.g., TaOx) is deposited in the trenches so that a portion of the activate layer material is positioned in the pockets and the channel surrounds the active layer on at least portions of three sides. In one embodiment, the active layer material is deposited using CVD or ALD. The result of step 760 is depicted in FIG. 12E which shows the additional of active material 900, 902, 904, 906, 908, and 910.

Figure 12F:
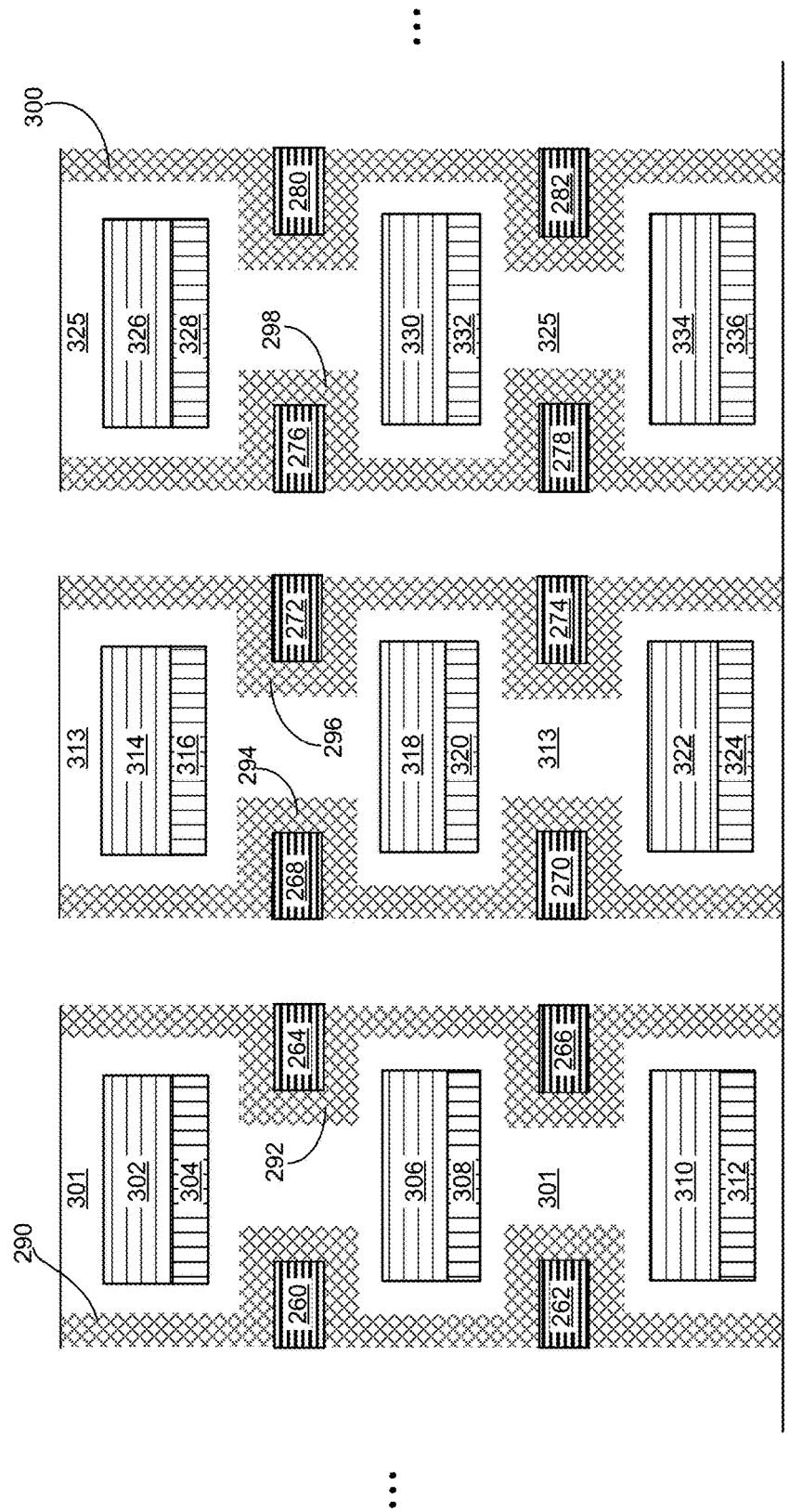

In step 762, the active layer material is etched to expose the channel material. For example, a reactive ion etching can be used, where the Silicon becomes a stopper for the etching. The results of step 762 are depicted in FIG. 12F which shows portions of active layer material missing such that the result is the active layers 260, 262, 264, 266, 268, 270, 272, 274, 276, 278, 280 and 282. Additionally, vertically elongated channels 290, 292, 294, 296, 298 and 300 are now exposed.

Figure 12G:
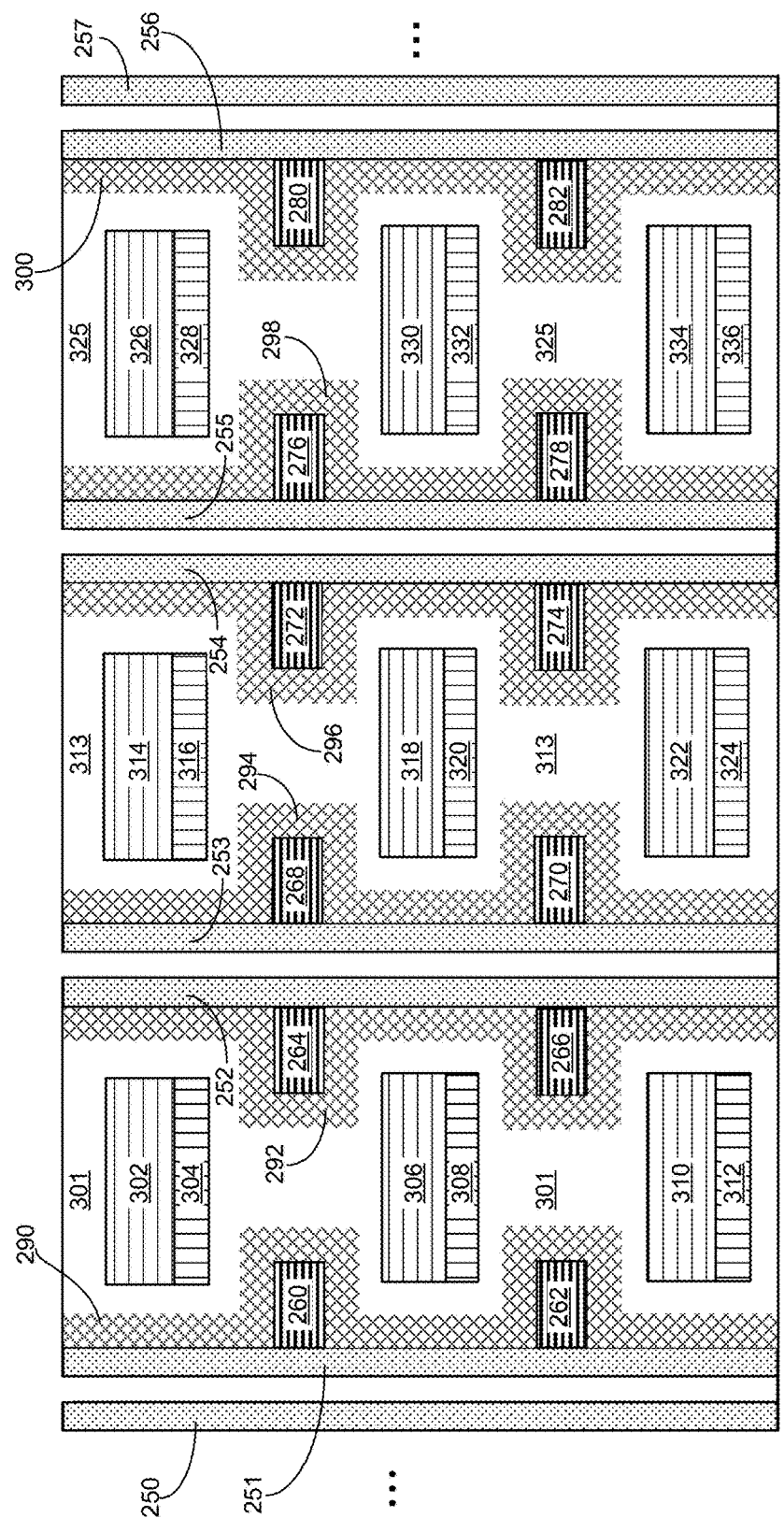

In step 764, the barrier layer is deposited. In one embodiment, the barrier layer is Amorphous Silicon. The barrier layer can be deposited using CVD, ALD or low pressure channel vapor deposition ("LPCVD"). The result of step 764 is depicted in FIG. 12G, which shows barrier layers 250, 251, 252, 253, 254, 255, 256 and 257.

Figure 12H:
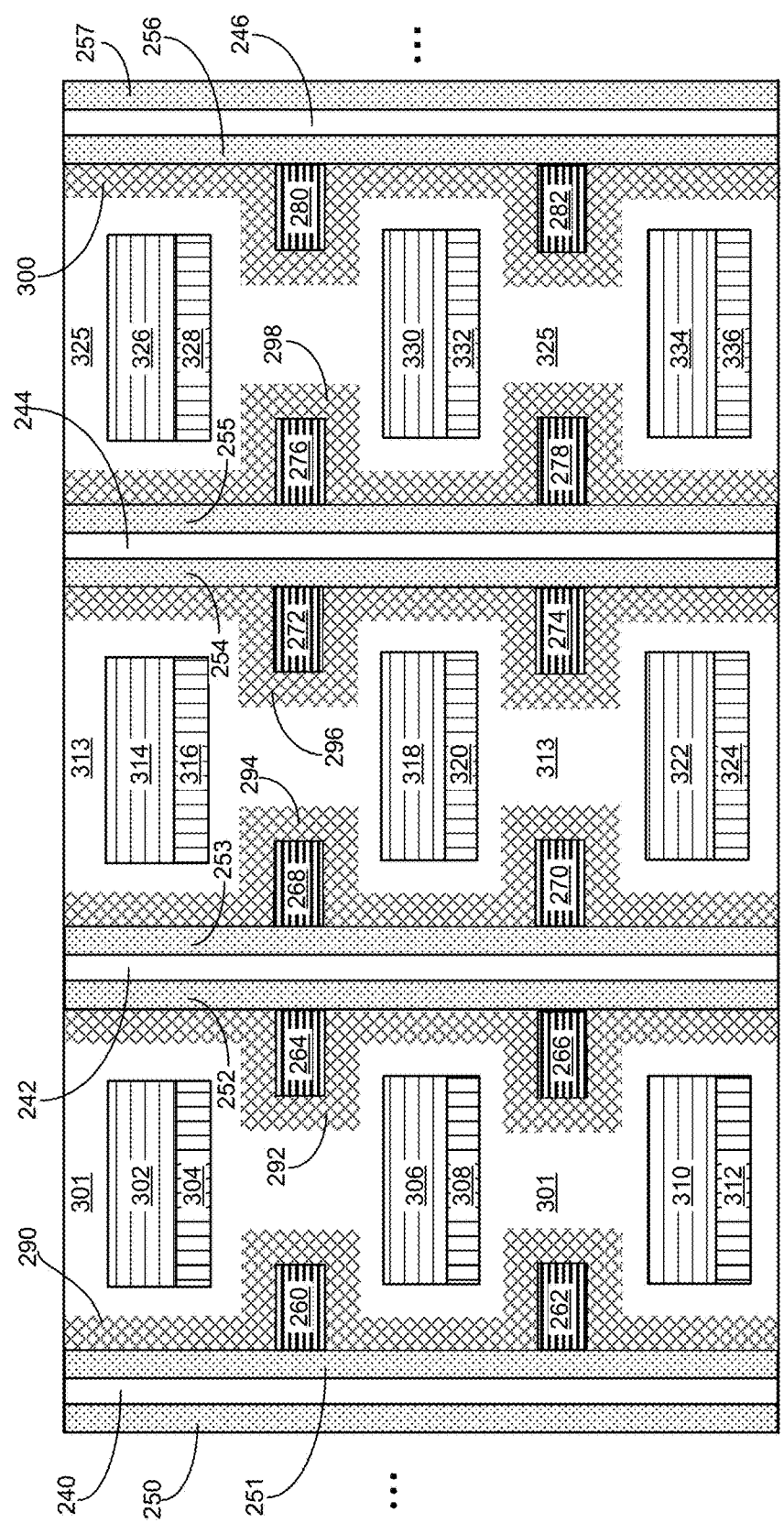

In step 766, plugging dielectric is deposited. For example, the dielectric can include $SiO_2$. The plugging dielectric can be deposited using CVD or ALD. The result of step 766 is depicted in FIG. 12H, which shows the addition of plugging dielectrics 240, 242, 244, and 246.

Figure 13:
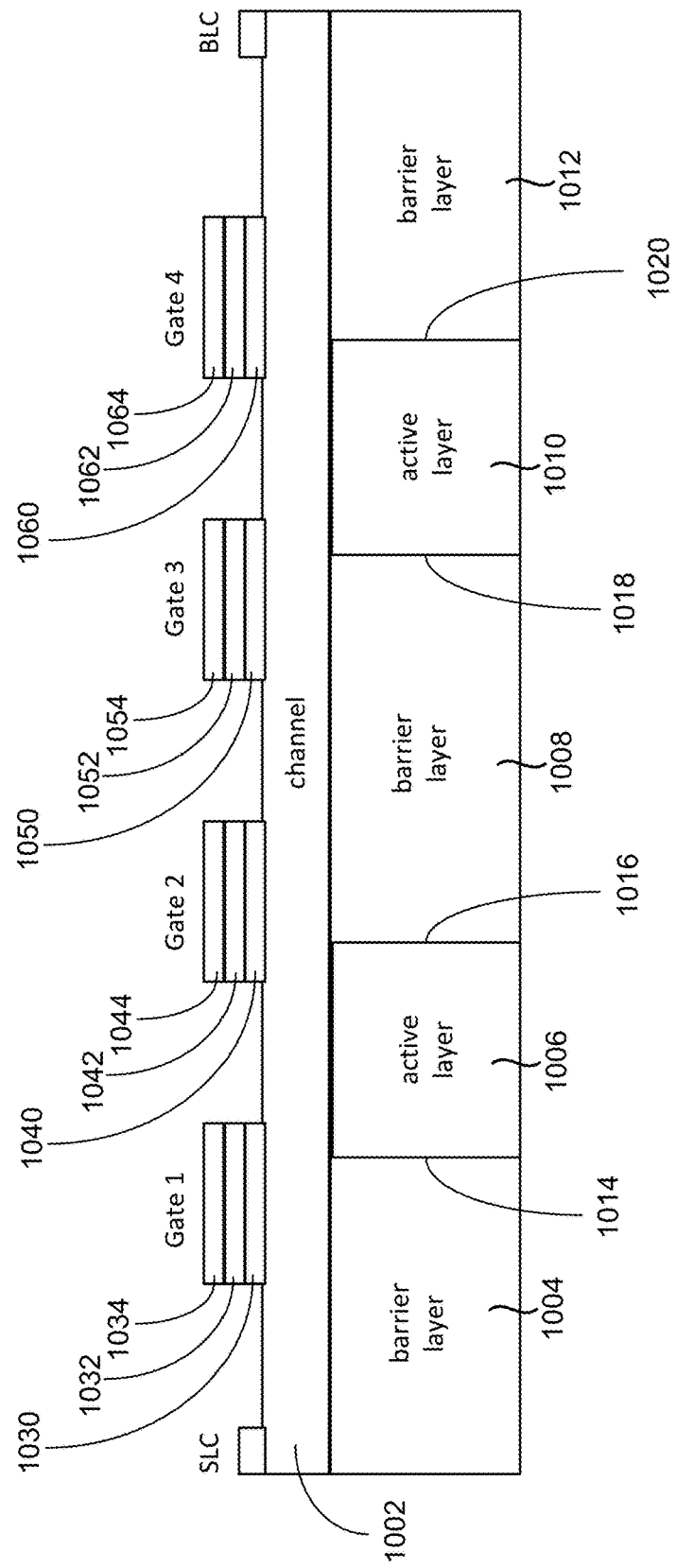
FIG. 13 depicts an example of serially connected non-volatile reversible resistance-switching memory cells.

The embodiment of FIG. 2 is a three dimensional structure which includes vertical sets of serially connected reversible resistance-switching memory cells. In other embodiments, memory structure 126 of FIG. 1 can be two dimensional memory array which include sets of serially connected reversible resistance-switching memory cells. FIG. 13 depicts one example of a set of serially connected reversible resistance-switching cells appropriate for a two dimensional memory array. In such a memory array, there will be multiple sets of connected memory cells as depicted in FIG. 13. The structure of FIG. 13 includes a channel layer 1002 (e.g., Si). Below the channel layer is barrier layer 1004, barrier layer 1008, and barrier layer 1012. Between barrier layer 1004 and barrier layer 1008 is active layer 1006. Between barrier layer 1008 and barrier layer 1012 is active layer 1010. FIG. 13 shows reversible resistance-switching interface 1014 between active layer 1006 and barrier layer 1004, reversible resistance-switching interface 1016 between active layer 1006 and barrier layer 1008, reversible resistance-switching interface 1018 between barrier layer 1008 and active layer 1010, and reversible resistance-switching interface 1020 between active layer 1010 and barrier layer 1012. These interfaces are used as discussed above to implement barrier modulated memory cells Each reversible resistance-switching interface (1014, 1016, 1018 and 1020) implements a memory cell of the serially connected reversible resistance-switching memory cells. Thus, FIG. 13 shows four serially connected reversible resistance-switching memory cells. Above each reversible resistance-switching interface is a gate. For example, above interface 1014 (and above channel 1002) is Gate 1, above interface 1016 (and above channel 1002) is Gate 2, above interface 1018 (and above channel 1002) is Gate 3, and above interface 1020 (and above channel 1002) is Gate 4. At one end of channel 1002 is source line connection (SLC). At the other end of channel 1002 is a bit line connection (BLC). Each of the gates depicted in FIG. 13 include three layers. The first layer of each gate (1030, 1040, 1050 and 1060) comprises a dielectric layer (e.g., $SiO_2$). The middle layer (1032, 1042, 1052, 1062) comprises a semiconductor layer (e.g., Si). The top layer (1034, 1044, 1054 and 1064) comprise a metal contact. With respect to the structure of FIG. 13, the plurality of serially connected non-volatile reversible resistance-switching memory cells include a common horizontal channel 1002 and the plurality of serially connected non-volatile reversible resistance-switching memory cells are horizontally displaced. Additionally, the gates overlap the barrier layer, the active layer and the reversible resistance-switching interface.

When a large enough voltage (e.g., 5 volts) is applied to a gate, that gate causes a depletion region to exist in channel 1002 to divert current from channel 1002 into the appropriate active layer or barrier layer, through the interface to the adjoining barrier or active layer and then back to the channel. Therefore, only memory cells with the gate voltage high enough are selected for a memory operation. Memory cells with a low gate voltage (e.g., 0 volts) will have no depletion region and the current will bypass those memory cells (e.g., current flows in channel). Thus, the memory cells of FIG. 13 will operate as discussed above with respect to FIGS. 4A, 4B, 5, 6 and 7.

Figure 14:
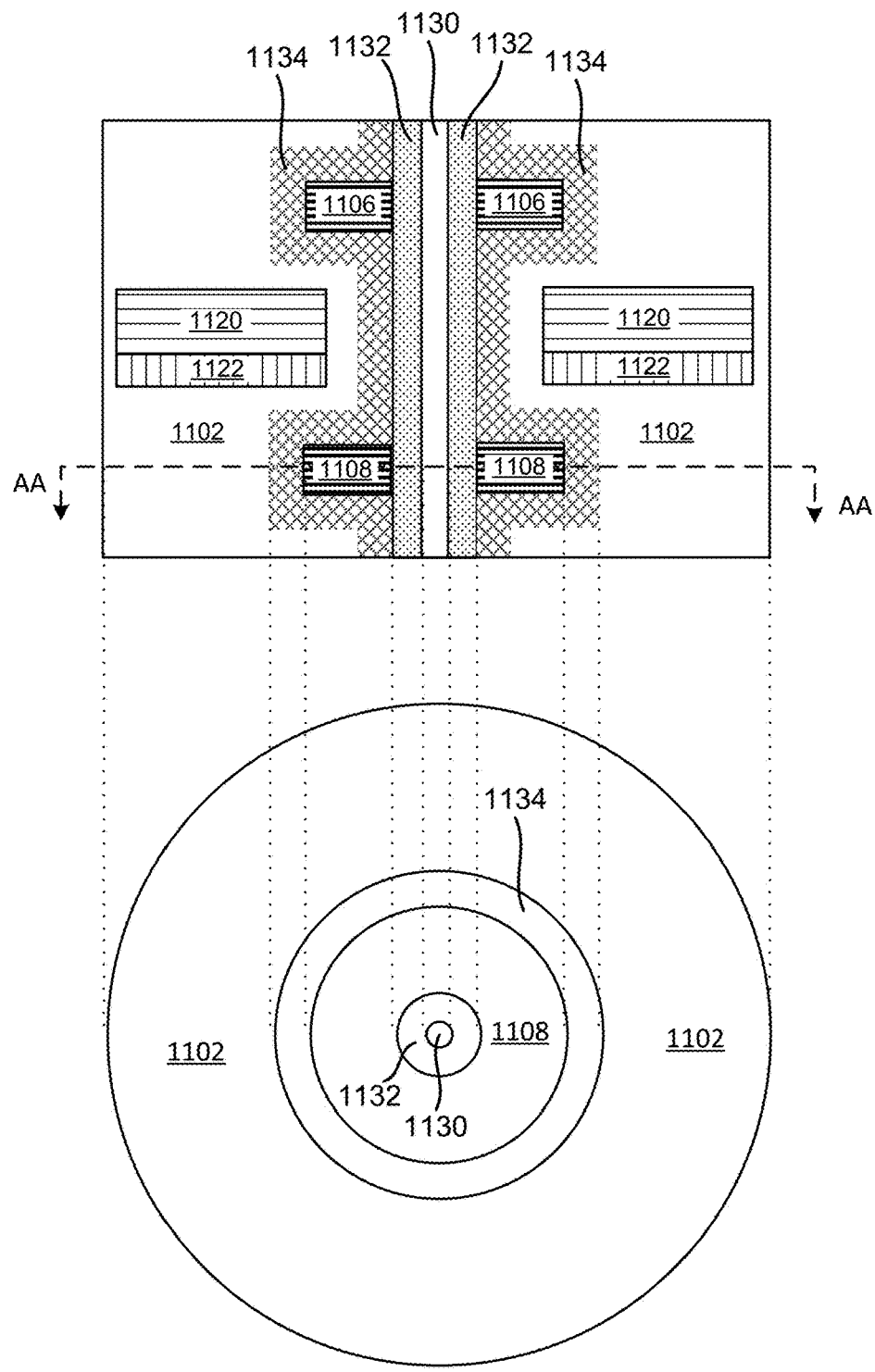
FIGS. 14 and 15 depict an embodiment of a monolithic three dimensional memory structure that includes memory holes comprising serially connected non-volatile reversible resistance-switching memory cells.
Figure 15:
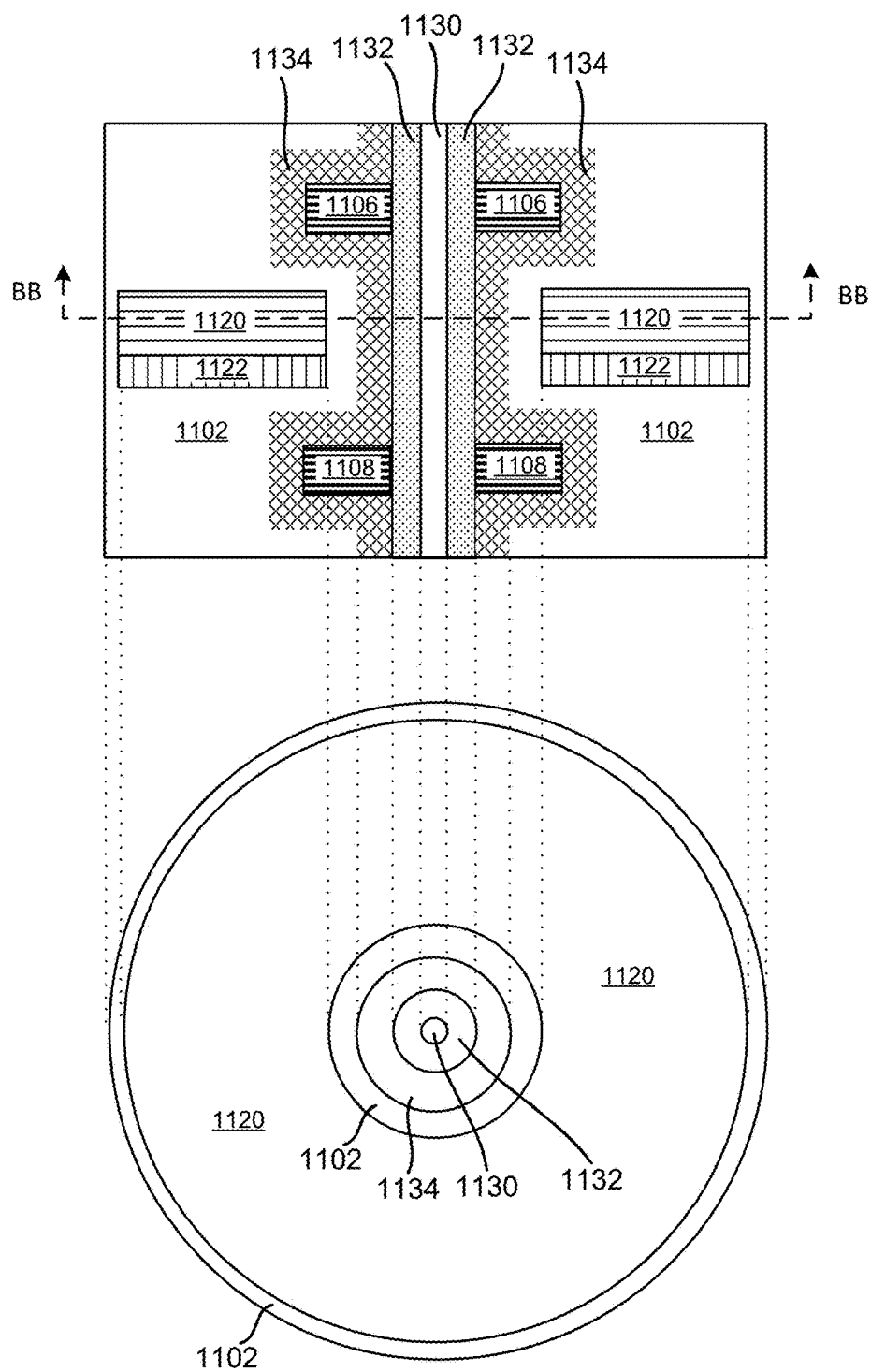

The embodiment of FIG. 2, as fabricated by the process of FIG. 11 utilizes a trench based fabrication process that creates a set of vertically elongated rails. In another embodiment, after creating the various layers depicted in FIG. 12A, holes can be drilled, these holes are referred to as memory holes. A structure somewhat similar to FIG. 2 can be fabricated inside the memory holes. However, the various layers inserted in the memory holes will be circular such as structure depicted by FIGS. 14 and 15. The top of FIGS. 14 and 15 show a portion of the memory structure. The same portion is depicted in both FIGS. 14 and 15. The bottom of FIG. 14 shows a top down cross section, where the cross section is taking along line AA of FIG. 14. FIG. 15 shows a top down cross section where the cross section is taking along line BB. As can be seen from the structures of FIGS. 14 and 15, the memory system includes dielectric material 1102. Positioned inside dielectric material 1102 is gate layer 1120 and offset layer 1122. The center of the memory hole includes a core including plugging dielectric 1130 surrounded by barrier layer 1132. Channel 1134 surrounds barrier layer 1132 and also surrounds (on three sides) active layer 1106 and active layer 1108. Cut AA of FIG. 14 is a cross section through active layer 1108. Cut BB of FIG. 15 is a cross section through word line layer 1120.

The proposed memory structures described above provides for a non-volatile memory where unselected memory cells are transparent to the current used to perform programming and/or reading. Thus, these unselected memory cells do not leak current and do not cause unnecessary use of power.

One embodiment includes a non-volatile storage apparatus, comprising: a first plurality of serially connected non-volatile reversible resistance-switching memory cells; a first plurality of word lines, each of the memory cells of the plurality are connected to a different word line of the first plurality of word lines; a first bit line connected to a first end of the first plurality of serially connected non-volatile reversible resistance-switching memory cells; and a first switch connected to a second end of the first plurality of serially connected non-volatile reversible resistance-switching memory cells.

In one example, the apparatus further comprises additional pluralities of serially connected non-volatile reversible resistance-switching memory cells, for each plurality of serially connected non-volatile reversible resistance-switching memory cells each of the memory cells is connected to a different word line of the first plurality of word lines; additional bit lines connected to the additional pluralities of serially connected non-volatile reversible resistance-switching memory cells, different bit lines are connected to different pluralities of serially connected non-volatile reversible resistance-switching memory cells; and additional switches connected to the additional pluralities of serially connected non-volatile reversible resistance-switching memory cells, different switches are connected to different pluralities of serially connected non-volatile reversible resistance-switching memory cells.

One embodiment includes a non-volatile storage apparatus, comprising: a plurality of vertically displaced reversible resistance-switching elements; a plurality of vertically displaced control line layers, each control line layer positioned between two consecutive reversible resistance-switching elements, each control line layer comprising an offset layer and an associated word line layer, the offset layer shields the associated word line layer form controlling one of the two consecutive reversible resistance-switching elements; a vertical channel layer positioned between the vertically displaced reversible resistance-switching elements and the vertically displaced control line layers; and a bit line connected to a first end of the channel layer.

One embodiment includes a non-volatile storage apparatus, comprising: a switch; a core comprising two vertical pillars of barrier layers separated by dielectric material positioned above the switch; a first plurality of vertically displaced active layers positioned on a first side of the core in contact with one of the vertical pillars of barrier layers; a second plurality of vertically displaced active layers positioned on a second side of the core in contact with one of the vertical pillars of barrier layers; a first vertical channel connected to the switch and positioned along a portion of the first side of the core and at least partially surrounding each of the first plurality of vertically displaced active layers on three sides; and a second vertical channel connected to the switch and positioned along a portion of the second side of the core and at least partially surrounding each of the second plurality of vertically displaced active layers on three sides.

One embodiment includes a method of operating non-volatile storage, comprising: applying one or more unselect signals to a set of unselected word lines to cause unselected serially connected reversible resistance-switching elements connected to the unselected word lines to be bypassed by current in an associated channel; and applying a select signal to a selected word line to cause current from the selected channel to be diverted from the selected channel into and through a reversible resistance-switching interface of a selected reversible resistance-switching element and subsequently back into the selected channel.

One embodiment includes a non-volatile storage apparatus, comprising: a first a reversible resistance-switching structure; a second a reversible resistance-switching structure; and a control region comprising a word line layer and an offset layer adjacent to the word line layer, the word line layer on a first side of the control region facing the first a reversible resistance-switching structure, the offset layer on a second side of the control region facing the second reversible resistance-switching structure, the offset layer shielding the word line layer from controlling the second reversible resistance-switching structure.

One embodiment includes a non-volatile storage apparatus, comprising: a dielectric region having a pocket; a word line layer inside and surrounded by the dielectric region, the word line layer positioned below the pocket; a reversible resistance-switching structure at least partially positioned in the pocket; and a channel layer positioned between the word line layer and the reversible resistance-switching structure, the channel layer at least partially positioned in the pocket.

One embodiment includes a non-volatile storage apparatus, comprising: a barrier layer; an active layer in contact with the barrier layer forming a reversible resistance-switching interface between the active layer and the barrier layer a gate layer that is in proximity to the reversible resistance-switching interface; and a channel region between the gate layer and the reversible resistance-switching interface.

One embodiment includes a non-volatile storage apparatus, comprising a reversible resistance-switching structure comprising a first material, a second material and a reversible resistance-switching interface between the first material and the second material; a channel; and means for switching current between current flowing through the channel and current flowing through the reversible resistance-switching interface in order to program and read the reversible resistance-switching interface.

One embodiment includes a method of operating non-volatile storage, comprising: unselecting a non-volatile memory cell so that current flows through a channel for the memory cell and bypasses a reversible resistance-switching interface between a first material and a second material; and selecting the non-volatile memory cell so that current flows through the reversible resistance-switching interface and bypasses at least a portion of the channel.

One embodiment includes a method for fabricating non-volatile memory, comprising: depositing multiple word line layers and multiple dielectric layers; creating trenches in the multiple word line layers and multiple dielectric layers; etching the multiple dielectric layers in the trenches to create pockets in the dielectric layers; adding channel material to the trenches; and adding active layers to the trenches so that a portion of each of the active layers is positioned in one of the pockets.

One embodiment includes a method for fabricating non-volatile memory, comprising: depositing repeating groups of at least three layers, each group of three layers comprising a word line layer, an offset layer adjacent the word line layer and a dielectric layer; creating trenches in the repeating groups of three layers; adding channel material to the trenches; and adding active layers vertically displaced in the trenches such that one of the word line layers and one of the offset layers are vertically positioned between neighboring active layers.

One embodiment includes a method for fabricating non-volatile memory, comprising: depositing multiple word line layers and multiple dielectric layers; creating trenches in the multiple word line layers and multiple dielectric layers; adding channel material to the trenches; and adding active layers to the trenches so that channel material at least partially surrounds each active layer on three sides.

One embodiment includes a method for fabricating non-volatile memory, comprising: creating multiple pluralities of serially connected non-volatile reversible resistance-switching memory cells including creating a plurality of word lines, each of the memory cells is connected to a different word line of the plurality of word lines; connecting bit lines to the pluralities of serially connected non-volatile reversible resistance-switching memory cells; and connecting selection switches to the pluralities of serially connected non-volatile reversible resistance-switching memory cells.

For purposes of this document, it should be noted that the dimensions of the various features depicted in the figures may not necessarily be drawn to scale.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more others parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. A method for fabricating non-volatile memory, comprising:
depositing multiple word line layers and multiple dielectric layers;
creating vertical trenches in the multiple word line layers and multiple dielectric layers;
etching the multiple dielectric layers in the vertical trenches to create pockets in the dielectric layers;
adding channel material to the vertical trenches; and
after adding the channel material to the vertical trenches, adding active layers to the vertical trenches so that a portion of each of the active layers is positioned in one of the pockets.

2. The method for fabricating non-volatile memory according to claim 1, wherein:
the multiple dielectric layers comprise an oxide; and
the etching the multiple dielectric layers in the vertical trenches to create pockets in the dielectric layers comprises selectively etching the oxide using a wet etch.

3. The method for fabricating non-volatile memory according to claim 1, wherein:
the adding channel material comprises depositing channel material in the vertical trenches so that a portion of the channel material is positioned in the pockets.

4. The method for fabricating non-volatile memory according to claim 1, wherein:
the adding active layers comprises depositing active layer material in the vertical trenches so that at least a portion of active layer material is positioned in the pockets and the channel material surrounds the active layer material on at least portions of three sides of the active layer material.

5. The method for fabricating non-volatile memory according to claim 1, wherein:
the adding active layers comprises depositing the active layer material in the vertical trenches so that the channel material surrounds the active layer material on three sides of the active layers.

6. The method for fabricating non-volatile memory according to claim 1, wherein:
the depositing multiple word line layers and multiple dielectric layers comprises depositing repeating groupings of three layer types comprising word line layers, offset layers adjacent the word line layers and dielectric layers.

7. The method for fabricating non-volatile memory according to claim 6, wherein:
the adding active layers comprises adding active layers vertically displaced in the vertical trenches such that one of the word line layers and one of the offset layers are vertically positioned between neighboring active layers.

8. The method for fabricating non-volatile memory according to claim 1, further comprising:
depositing a barrier layer that is vertically elongated, the barrier layer is positioned outside of the vertical trenches and between two of the vertical trenches; and
depositing plugging dielectric that is vertically elongated, the plugging dielectric is positioned outside of the vertical trenches and between two of the vertical trenches.

9. The method for fabricating non-volatile memory according to claim 1, further comprising:
fabricating selection layer with select gates, the select gates connect to the channel material.

10. The method for fabricating non-volatile memory according to claim 1, wherein:
the word line layers and multiple dielectric layers are deposited so that they are vertically displaced;
the channel material forms a vertical channel; and
the active layers are vertically displaced.

11. The method for fabricating non-volatile memory according to claim 1, wherein:

the adding channel material comprises depositing channel material in vertical trenches so that a portion of the channel material is positioned in the pockets;

the adding active layers comprises depositing active layer material in the vertical trenches so that at least a portion of active layer material is positioned in the pockets and the channel material surrounds the active layer material on at least portions of three sides of the active layer material;

the depositing multiple word line layers and multiple dielectric layers comprises depositing repeating groupings of three layer types comprising word line layers, offset layers adjacent the word line layers and dielectric layers; and the adding active layers comprises adding active layers vertically positioned in the vertical trenches such that one of the word line layers and one of the offset layers are vertically positioned between neighboring active layers.

12. A method for fabricating non-volatile memory, comprising:

depositing repeating groups of at least three layers, each group of three layers comprising a word line layer, an offset layer adjacent the word line layer and a dielectric layer;

creating trenches in the repeating groups of three layers;

adding channel material to the trenches; and adding active layers in the trenches such that one of the word line layers and one of the offset layers are vertically positioned between neighboring active layers.

13. The method for fabricating non-volatile memory according to claim 12, wherein:

the adding active layers deposits the active layers such that the channel material at least partially surrounds each active layer on three sides.

14. The method for fabricating non-volatile memory according to claim 12, further comprising:

depositing a barrier layer that is vertically elongated, the barrier layer is positioned outside of the trenches and between two of the trenches; and depositing plugging dielectric that is vertically elongated, the plugging dielectric is positioned outside of the vertical trenches and between two of the vertical trenches, the channel material forms a vertical channel.

15. A method for fabricating non-volatile memory, comprising:

depositing multiple word line layers and multiple dielectric layers;

creating trenches in the multiple word line layers and multiple dielectric layers;

adding channel material to the trenches; and adding active layers to the trenches so that channel material at least partially surrounds each active layer on three sides.

16. The method for fabricating non-volatile memory according to claim 12, wherein:

the depositing multiple word line layers and multiple dielectric layers comprises depositing repeating groups of three layers, each group of three layers comprising a word line layer, an offset layer adjacent the word line layer and a dielectric layer.

17. The method for fabricating non-volatile memory according to claim 16, wherein:

the adding active layers comprises adding active layers vertically in the trenches such that one of the word line layers and one of the offset layers are vertically positioned between neighboring active layers.

* * * * *